(12) United States Patent
Kim et al.

(10) Patent No.: US 11,437,115 B2
(45) Date of Patent: Sep. 6, 2022

(54) SEMICONDUCTOR MEMORY DEVICES AND METHODS OF OPERATING SEMICONDUCTOR MEMORY DEVICES

(71) Applicant: Samsung Electronics Co., Ltd., Suwon-si (KR)

(72) Inventors: Sungrae Kim, Seoul (KR); Kijun Lee, Seoul (KR); Myungkyu Lee, Seoul (KR); Hoyoun Kim, Seoul (KR); Suhun Lim, Gwangju (KR); Sunghye Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/326,416

(22) Filed: May 21, 2021

(65) Prior Publication Data

US 2022/0139482 A1    May 5, 2022

(30) Foreign Application Priority Data

Nov. 4, 2020   (KR) .......................... 10-2020-0145769

(51) Int. Cl.
*G11C 29/00* (2006.01)
*G11C 29/42* (2006.01)
*G06F 11/10* (2006.01)

(52) U.S. Cl.
CPC .......... *G11C 29/42* (2013.01); *G06F 11/1068* (2013.01)

(58) Field of Classification Search
None
See application file for complete search history.

(56) References Cited

U.S. PATENT DOCUMENTS 4,584,681 A    4/1986 Singh et al.
6,973,613 B2   12/2005 Cypher
(Continued)

FOREIGN PATENT DOCUMENTS

KR    101912372 B1    10/2018

OTHER PUBLICATIONS

X. Guo, M. N. Bojnordi, Q. Guo and E. Ipek, "Sanitizer: Mitigating the Impact of Expensive ECC Checks on STT-MRAM Based Main Memories," in IEEE Transactions on Computers, vol. 67, No. 6, pp. 847-860, Jun. 1, 2018, doi: 10.1109/TC.2017.2779151. (Year: 2018).*

*Primary Examiner* — Daniel F. McMahon
(74) *Attorney, Agent, or Firm* — Harness, Dickey & Pierce, P.L.C.

(57) ABSTRACT

A semiconductor memory device includes a memory cell array, an error correction code (ECC) engine, row fault detector circuitry and control logic circuitry. The memory cell array includes a plurality of memory cell rows. The control logic circuitry controls the ECC engine circuitry to perform a plurality of error detection operations on each of the memory cell rows. The control logic circuitry controls the row fault detector circuitry to store an error parameter associated with each of a plurality of codewords in each of which at least one error is detected by accumulating the error parameter for each of a plurality of defective memory cell rows. The row fault detector circuitry determines whether a row fault occurs in each of the plurality of defective memory cell rows based on a number of changes of the error parameter.

20 Claims, 22 Drawing Sheets

(56) References Cited

U.S. PATENT DOCUMENTS

| | | | |
|---|---|---|---|
| 7,134,069 B1 * | 11/2006 | Longwell | G06F 11/106 |
| | | | 714/763 |
| 7,272,773 B2 | 9/2007 | Cargnoni et al. | |
| 7,308,621 B2 * | 12/2007 | Adams | G11C 29/42 |
| | | | 714/763 |
| 7,844,886 B1 * | 11/2010 | Ngo | G11C 7/1006 |
| | | | 714/725 |
| 7,900,100 B2 | 3/2011 | Gollub | |
| 8,205,136 B2 | 6/2012 | Bell, Jr. et al. | |
| 8,413,007 B2 | 4/2013 | Pawlowski et al. | |
| 8,996,956 B2 | 3/2015 | Yang et al. | |
| 10,049,006 B2 * | 8/2018 | Reed | G11C 7/02 |
| 11,269,723 B2 * | 3/2022 | Cha | H03M 13/1575 |
| 2003/0191888 A1 * | 10/2003 | Klein | G11C 11/4076 |
| | | | 711/105 |
| 2017/0161144 A1 * | 6/2017 | Reed | G11C 7/02 |
| 2018/0197597 A1 * | 7/2018 | Kim | G11C 29/52 |
| 2020/0387323 A1 * | 12/2020 | Boehm | G06F 11/106 |
| 2021/0224155 A1 * | 7/2021 | Bains | G06F 11/0784 |
| 2021/0286670 A1 * | 9/2021 | Rooney | G11C 11/406 |
| 2022/0050748 A1 * | 2/2022 | Kim | G11C 11/4087 |

\* cited by examiner

| | EADDR | SDR | CV |
|---|---|---|---|
| Idx11 → | RAa | SDRa | 1 |
| Idx12 → | RAb | SDRb1→SDRb2 | 2 |
| Idx13 → | RAc | SDRc | 1 |
| | 661 | 662 | 663 |

| | EADDR | CA | CV |
|---|---|---|---|
| Idx21 → | RAa | CAa | 1 |
| Idx22 → | RAb | CAb1→CAb2 | 2 |
| Idx23 → | RAc | CAc | 1 |
| | 664 | 665 | 666 |

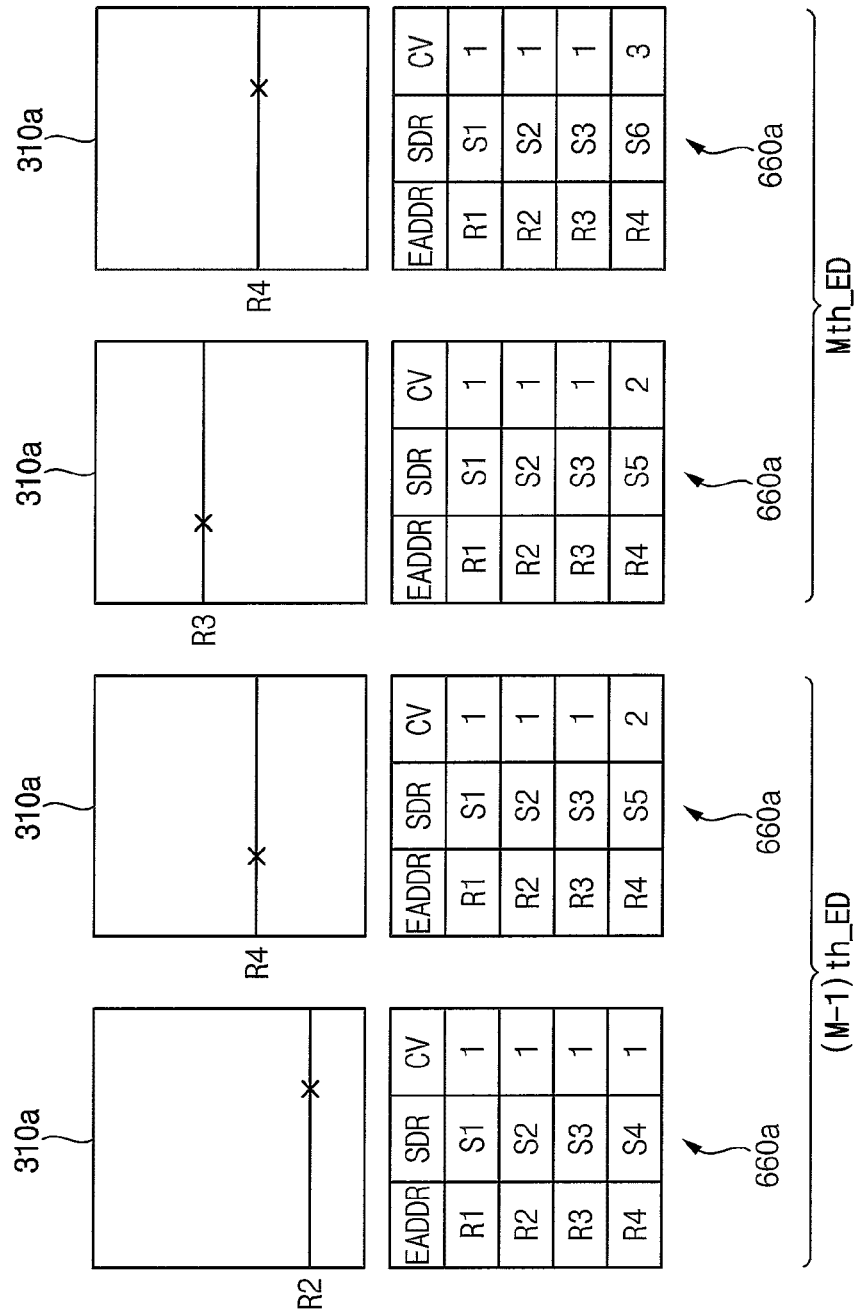

SEMICONDUCTOR MEMORY DEVICES AND METHODS OF OPERATING SEMICONDUCTOR MEMORY DEVICES

CROSS-REFERENCE TO RELATED APPLICATIONS

This application claims the benefit of priority under 35 USC § 119 to Korean Patent Application No. 10-2020-0145796, filed on Nov. 4, 2020, in the Korean Intellectual Property Office, the disclosure of which is incorporated by reference in its entirety herein.

BACKGROUND

Example embodiments relate to memories, and more particularly to semiconductor memory devices and methods of operating semiconductor memory devices.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrinking of the fabrication design rule of DRAMs, bit errors of memory cells in the DRAMs may increase and/or a yield of the DRAMs may decrease.

SUMMARY

Example embodiments may provide a more credible semiconductor memory device.

Example embodiments may provide a more credible method of operating a semiconductor memory device.

According to at least some example embodiments of the inventive concepts, a semiconductor memory device includes a memory cell array including a plurality of memory cell rows, each of the plurality of memory cell rows including volatile memory cells; error correction code (ECC) engine circuitry; row fault detector circuitry; and control logic circuitry configured to control the ECC engine circuitry to perform a plurality of error detection operations on respective one of the plurality of memory cell rows, wherein the control logic circuitry is configured to control the row fault detector circuitry to, store an error parameter associated with each of a plurality of codewords in each of which at least one error is detected during the plurality of error detection operations, and accumulate the error parameter for each of a plurality of defective memory cell rows in each of which the at least one error is detected, and wherein the row fault detector circuitry is configured to determine whether a row fault occurs in each of the plurality of defective memory cell rows based on a number of changes of the error parameter.

According to at least some example embodiments of the inventive concepts, in a method of operating a semiconductor memory device including a memory cell array that includes a plurality of memory cell rows and each of the plurality of memory cell rows including a plurality of volatile memory cells, a plurality of error detection operations are performed, by an error correction code (ECC) engine, on respective one of the plurality of memory cell rows, syndrome or column address associated with each of a plurality of codewords in each of which at least one error is detected during the plurality of error detection operations are stored, by a row fault detector, in an error parameter storing table by accumulating the syndrome or the column address for each of a plurality of defective memory cell rows in each of which the at least one error is detected, and whether a row fault occurs in each of the plurality of defective memory cell rows is determined by the row fault detector based on a number of changes of the syndrome or the column address stored in the error parameter storing table.

According to at least some example embodiments, a semiconductor memory device includes a memory cell array including a plurality of memory cell rows, each of the plurality of memory cell rows including volatile memory cells; error correction code (ECC) engine circuitry; row fault detector circuitry; and control logic circuitry configured to control the ECC engine circuitry to perform a plurality of error detection operations on respective one of the plurality of memory cell rows, wherein the control logic circuitry is configured to control the row fault detector circuitry to store an error parameter associated with each of a plurality of codewords in each of which at least one error is detected during the plurality of error detection operations, therein by accumulating the error parameter for each of a plurality of defective memory cell rows in each of which the at least one error is detected, and wherein the row fault detector circuitry is configured to determine whether a row fault occurs in each of the plurality of defective memory cell rows based on a number of changes of the error parameter, wherein the error parameter includes a syndrome or a column address associated with the plurality of codewords in each of which the at least one error is detected, and wherein the row fault detector circuitry includes: an error parameter storing table configured to store addresses of the plurality of defective memory cell rows as error addresses and configured to store the error parameter by accumulating the error parameter for each of the error addresses; an address comparator configured to compare a current error address obtained through a current error detection operation and a previous error address obtained through a previous error detection operation to output an address comparison signal; and a syndrome comparator configured to compare a current syndrome obtained through the current error detection operation and a previous syndrome obtained through the previous error detection operation to output a syndrome comparison signal, and wherein the row fault detector circuitry is further configured to selectively store the error parameter in the error parameter storing table based on the address comparison signal and the syndrome comparison signal and configured to record the number of changes in the error parameter storing table.

Accordingly, the semiconductor memory device may include a control logic circuit, ECC engine circuitry and row fault detector circuitry. The control logic circuitry may control the row fault detector circuitry to store error addresses of defective memory cell rows and error parameter associated with codewords in which the error is detected therein by accumulating the error addresses and the error parameter. The row fault detector circuitry may determine whether a row fault occurs in each of the defective memory cell rows based on a number of changes of the error parameter. Therefore, the semiconductor memory device may determine whether each of the defective memory cell rows has single bit error or a row fault based on the number of changes.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 14 is an example of the error parameter storing table in FIG. 13 when the error parameter corresponds to the syndrome according to at least some example embodiments of the inventive concepts.

FIG. 15 is an example of the error parameter storing table in FIG. 13 when the error parameter corresponds to the column address according to at least some example embodiments of the inventive concepts.

FIGS. 21A and 21B illustrate an example of operation of the row fault detector in FIG. 13 according to at least some example embodiments of the inventive concepts.

DETAILED DESCRIPTION

Figure 1:
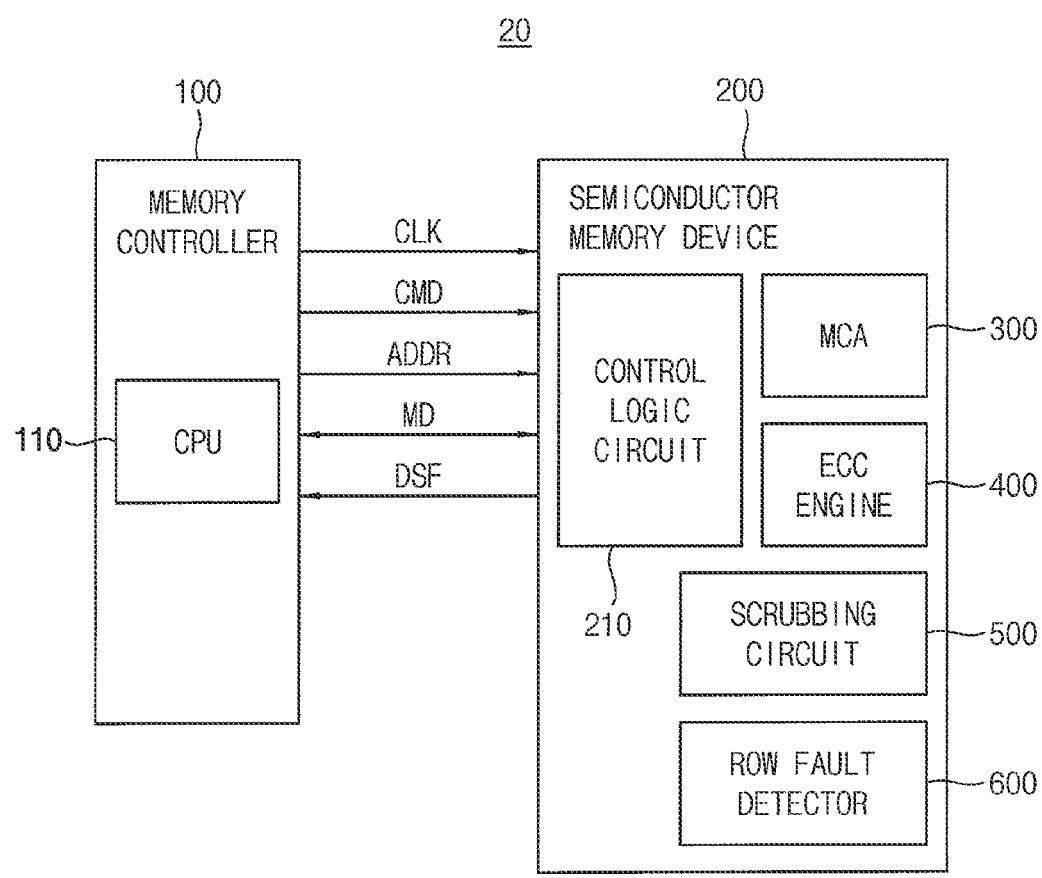
FIG. 1 is a block diagram illustrating a memory system according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a memory system according to at least some example embodiments of the inventive concepts.

Referring to FIG. 1, a memory system 20 may include a memory controller 100 and/or a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host. The memory controller 100 may include a central processing unit (CPU) 110 to control operation of the memory controller 100.

In addition, the memory controller 100 may issue operation commands to the semiconductor memory device 200 for controlling the semiconductor memory device 200.

In some example embodiments, the semiconductor memory device 200 is a memory device including volatile memory cells such as a dynamic random access memory (DRAM), double data rate 4 (DDR4) synchronous DRAM (SDRAM), a low power DDR4 (LPDDR4) SDRAM, a LPDDR5 SDRAM or a LPDDR6 SDRAM.

The memory controller 100 may transmit a clock signal CLK, a command CMD, and/or an address (signal) ADDR to the semiconductor memory device 200 and exchanges main data MD with the semiconductor memory device 200. The memory controller 100 transmits a write data to the semiconductor memory device 200 and receives a read data from the semiconductor memory device 200.

The semiconductor memory device 200 may include a memory cell array 300 that stores the main data MD and parity bits (parity data) generated based on the main data MD, an error correction code (ECC) engine 400, a control logic circuit 210 a scrubbing circuit 500 and a row fault detector 600.

The ECC engine 400 may perform ECC encoding on a write data to be stored in a target page of the memory cell array 300, and may perform ECC decoding or decoding on a codeword read from the target page under control of the control logic circuit 210. The control logic circuit 210 may be or include processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc.

The processing circuitry of the control logic circuit 210 may be configured, via hardware and/or software (e.g., firmware), to perform and/or control any operation described in the specification as being performed by a control logic circuit or an element thereof. The control logic circuit 210 may also be referred to in the present specification as control logic circuitry 210.

The scrubbing circuit 500 may generate scrubbing addresses such that normal scrubbing operation is performed on a selected memory cell row of a plurality of memory cell rows whenever refresh operation is performed on N memory cell rows when the refresh operation is performed on the plurality of memory cell rows included in the memory cell array 300. Here, N is a natural number greater than one. The scrubbing circuit 50 may also be referred to in the present specification as scrubbing circuitry 500.

The control logic circuit 210 may control the ECC engine 400 to perform the normal scrubbing operation such that the ECC engine 400 reads data corresponding to a first codeword, from at least one sub-page, designated by the scrubbing address, in the selected memory cell row, corrects at least one error bit (or error) in the first codeword and writes back the corrected first codeword in a memory location corresponding to the at least one sub-page.

The control logic circuit 210 may control the row fault detector 600 to store an error parameter associated with each of a plurality of codewords in each of which at least one error is detected during a plurality of error detection operations performed by the ECC engine 400, therein by accumulating the error parameter for each of a plurality of defective memory cell rows in each of which the at least one error is detected. The row fault detector 600 may determine whether a row fault occurs in each of the plurality of defective memory cell rows based on a number of changes of the error parameter stored therein and may transmit a decoding status flag DSF indicating that the row fault occurs to the memory controller (the external memory controller) 100.

The memory controller 100 may receive the decoding status flag DSF and may control the control logic circuit 210 to perform a post package repair on the defective memory cell row in which the row fault occurs based on the decoding status flag DSF.

Figure 2:
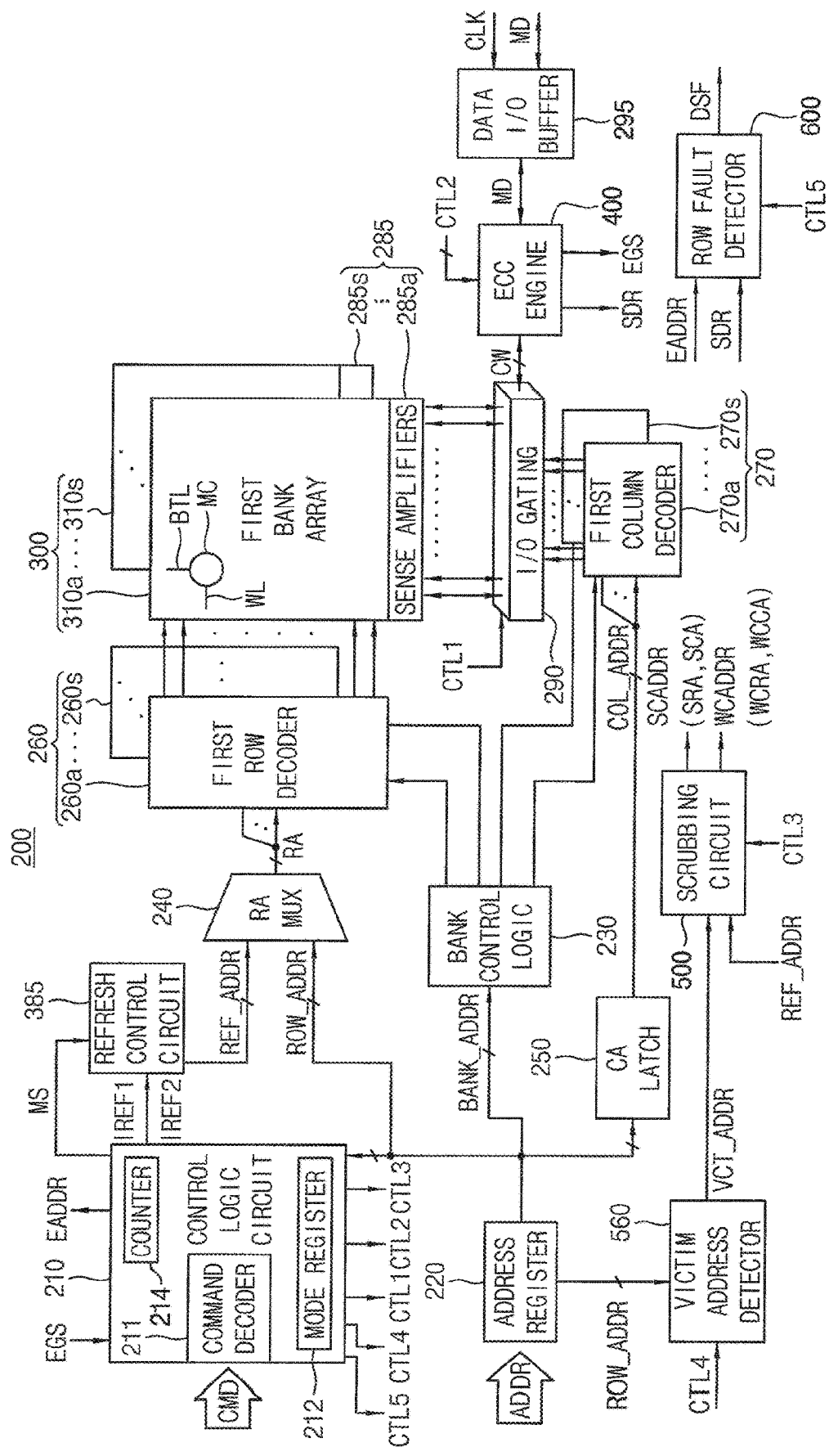
FIG. 2 is a block diagram illustrating the semiconductor memory device in FIG. 1 according to at least some example embodiments of the inventive concepts.

FIG. 2 is a block diagram illustrating the semiconductor memory device in FIG. 1 according to at least some example embodiments of the inventive concepts.

Referring to FIG. 2, the semiconductor memory device 200 may include the control logic circuit 210, an address register 220, a bank control logic 230, a refresh control circuit 385, a row address multiplexer 240, a column address latch 250, a row decoder 260, a column decoder 270, the memory cell array 300, a sense amplifier unit 285, an input/output (I/O) gating circuit 290, the ECC engine 400, the scrubbing circuit 500, a victim address detector 560, a data I/O buffer 295, and/or the row fault detector 600.

The memory cell array 300 may include first through sixteenth bank arrays 310a~310s. The row decoder 260 may include first through sixteenth bank row decoders 260a~260s respectively coupled to the first through sixteenth bank arrays 310a~310s, the column decoder 270 may include first through sixteenth bank column decoders 270a~270s respectively coupled to the first through sixteenth bank arrays 310a~310s, and the sense amplifier unit 285 may include first through sixteenth bank sense amplifiers 285a~285s respectively coupled to the first through sixteenth bank arrays 310a~310s.

The first through sixteenth bank arrays 310a~310s, the first through sixteenth bank row decoders 260a~260s, the first through sixteenth bank column decoders 270a~270s and first through sixteenth bank sense amplifiers 285a~285s may form first through sixteenth banks. Each of the first through sixteenth bank arrays 310a~310s may include a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through sixteenth bank row decoders 260a~260s corresponding to the bank address BANK_ADDR is activated in response to the bank control signals, and one of the first through sixteenth bank column decoders 270a~270s corresponding to the bank address BANK_ADDR is activated in response to the bank control signals.

The row address multiplexer 240 receives the row address ROW_ADDR from the address register 220, and receives a refresh row address REF_ADDR from the refresh control circuit 385. The row address multiplexer 240 selectively outputs the row address ROW_ADDR or the refresh row address REF_ADDR as a row address RA. The row address RA that is output from the row address multiplexer 240 is applied to the first through sixteenth bank row decoders 260a~260s.

The refresh control circuit 385 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may apply the first refresh control signal IREF1 to the refresh control circuit 385 whenever the control logic circuit 210 receives the auto refresh command. When the command CMD from the memory controller 100 corresponds to a self-refresh entry command, the control logic circuit 210 may applies the second refresh control signal IREF2 to the refresh control circuit 385 and the second refresh control signal IREF2 is activated from a time point when the control logic circuit 210 receives the self-refresh entry command to a time point when control logic circuit 210 receives a self-refresh exit command.

The refresh control circuit 385 may sequentially increase or decrease the refresh row address REF_ADDR in response to receiving the first refresh control signal IREF1 or during the second refresh control signal IREF2 is activated.

The activated one of the first through sixteenth bank row decoders 260a~260s, by the bank control logic 230, decodes the row address RA that is output from the row address multiplexer 240 or a target scrubbing row address TSRA, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some example embodiments, in a burst mode, the column address latch 250 generates column addresses that increment from the received column address COL_ADDR. The column address latch 250 applies the temporarily stored or generated column address to the first through sixteenth bank column decoders 270a~270s.

The activated one of the first through sixteenth bank column decoders 270a~270s activates a sense amplifier corresponding to the bank address BANK_ADDR and the column address COL_ADDR or a target scrubbing column address TSCA through the I/O gating circuit 290.

The I/O gating circuit 290 may include circuitry for gating input/output data, and further may include input data mask logic, read data latches for storing data that is output from the first through sixteenth bank arrays 310a~310s, and/or write drivers for writing data to the first through sixteenth bank arrays 310a~310s.

Codeword CW read from one bank array of the first through sixteenth bank arrays 310a~310s is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through sixteenth bank arrays 310a~310s may be provided to the data I/O buffer 295 from the memory controller 100, may be provided to the ECC engine 400 from the data I/O buffer 295, the ECC engine 400 may perform an ECC encoding on the main data MD to generate parity bits, the ECC engine 400 may provide the main data MD and the parity bits to the I/O gating circuit 290 and the I/O gating circuit 290 may write the main data MD and the parity bits in a sub-page in one bank array through the write drivers.

The data I/O buffer 295 may provide the main data MD from the memory controller 100 to the ECC engine 400 in a write operation of the semiconductor memory device 200, based on the clock signal CLK and may provide the main data MD from the ECC engine 400 to the memory controller 100 in a read operation of the semiconductor memory device 200.

The scrubbing circuit 500 may count the refresh row address REF_ADDR which sequentially changes and may output a normal scrubbing address SCADDR whenever the scrubbing circuit 500 counts N refresh row addresses. Here, N is an integer greater than one. The normal scrubbing address SCADDR may include a scrubbing row address SRA and a scrubbing column address SCA.

The scrubbing circuit 500 may provide the scrubbing row address SRA and the scrubbing column address SCA to the row decoder 260 and the column decoder 270, respectively in a first scrubbing mode. The ECC engine 400 may store addresses of the weak codewords in each of which an error bit is detected during a normal scrubbing operation.

The ECC engine 400 may perform an ECC decoding on a codeword read from a sub-page of the target page in the normal scrubbing operation or a normal read operation, may provide an error generation signal EGS to the control logic circuit 210 with correcting at least one error bit and may provide the row fault detector 600 with a syndrome SDR associated with the codeword when the at least one error bit is detected in the main data in the codeword.

The control logic circuit 210 may store a row address and a column address of the codeword including the at least one error bit, in an error parameter soring table in the row fault detector 600 as an error address EADDR.

In some example embodiments, the ECC engine 400 instead of the control logic circuit 210 may store directly the error address EADDR error parameter soring table in the row fault detector 600.

The ECC engine 400, during the scrubbing operation, perform an ECC decoding on a weak codeword from a weak sub-page, corrects at least one error bit in the weak codeword and writes back the corrected weak codeword in a memory location corresponding to the weak sub-page.

The victim address detector 560 may count a number of accesses to a first memory region in the memory cell array 300 to generate at least one victim address VCT_ADDR designating at least one adjacent memory region adjacent to the first memory region when the number of the counted accesses reaches the a reference value during a reference interval. The victim address detector 560 may provide the at least one victim address VCT_ADDR to the row decoder 260 such that a target refresh operation is performed on the least one adjacent memory region. In some example embodiments, the victim address detector 560 may store the at least one victim address VCT_ADDR in the address storing table in the scrubbing circuit 500.

The scrubbing circuit 500, in a second scrubbing mode, may output an address of codeword associated with the victim address VCT_ADDR stored in the address storing table as a weak codeword address WCADDR. The weak codeword address WCADDR may include a weak codeword row address WCRA and a weak codeword column address WCCA. The scrubbing circuit 500 may provide the weak codeword row address WCRA and the weak codeword column address WCCA to the row decoder 260 and the column decoder 270, respectively in the second scrubbing mode. The victim address detector 560 may be implemented by one or more circuits or circuitry. Accordingly, victim address detector 560 may also be referred to, in the present specification, as victim address detector circuitry 560. Circuitry of the victim address detector 560 may be configured, via hardware and/or software (e.g., firmware), to perform and/or control any operation described in the specification as being performed by a victim address detector or an element thereof.

The row fault detector 600 may store the error address EADDR and the syndrome associated with each of a plurality of codewords in each of which at least one error is detected as an error parameter by accumulating the error address EADDR and the syndrome. The row fault detector 600 may determine whether a row fault occurs in each of the plurality of defective memory cell rows based on a number of changes of the error parameter stored in the row fault detector 600. The row fault detector 600 may output the decoding status flag DSF indicating that the row fault occurs.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100 and a mode register 212 that sets an operation mode of the semiconductor memory device 200. The control logic circuit 210 may include a counter 214 that counts the error generation signal EGS.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC engine 400, a third control signal CTL3 to control the scrubbing circuit 500, a fourth control signal CTL4 to control the victim address detector 560 and a fifth control signal CTL5 to control the row fault detector 600.

In addition, the control logic circuit 210 may provide the refresh control circuit 385 with a mode signal MS associated with a refresh period. The control logic circuit 210 may generate the mode signal MS based on a temperature signal representing an operating temperature of the semiconductor memory device 200. In addition, the control logic circuit 210 may provide the error address EADDR to the row fault detector 600.

Figure 3:
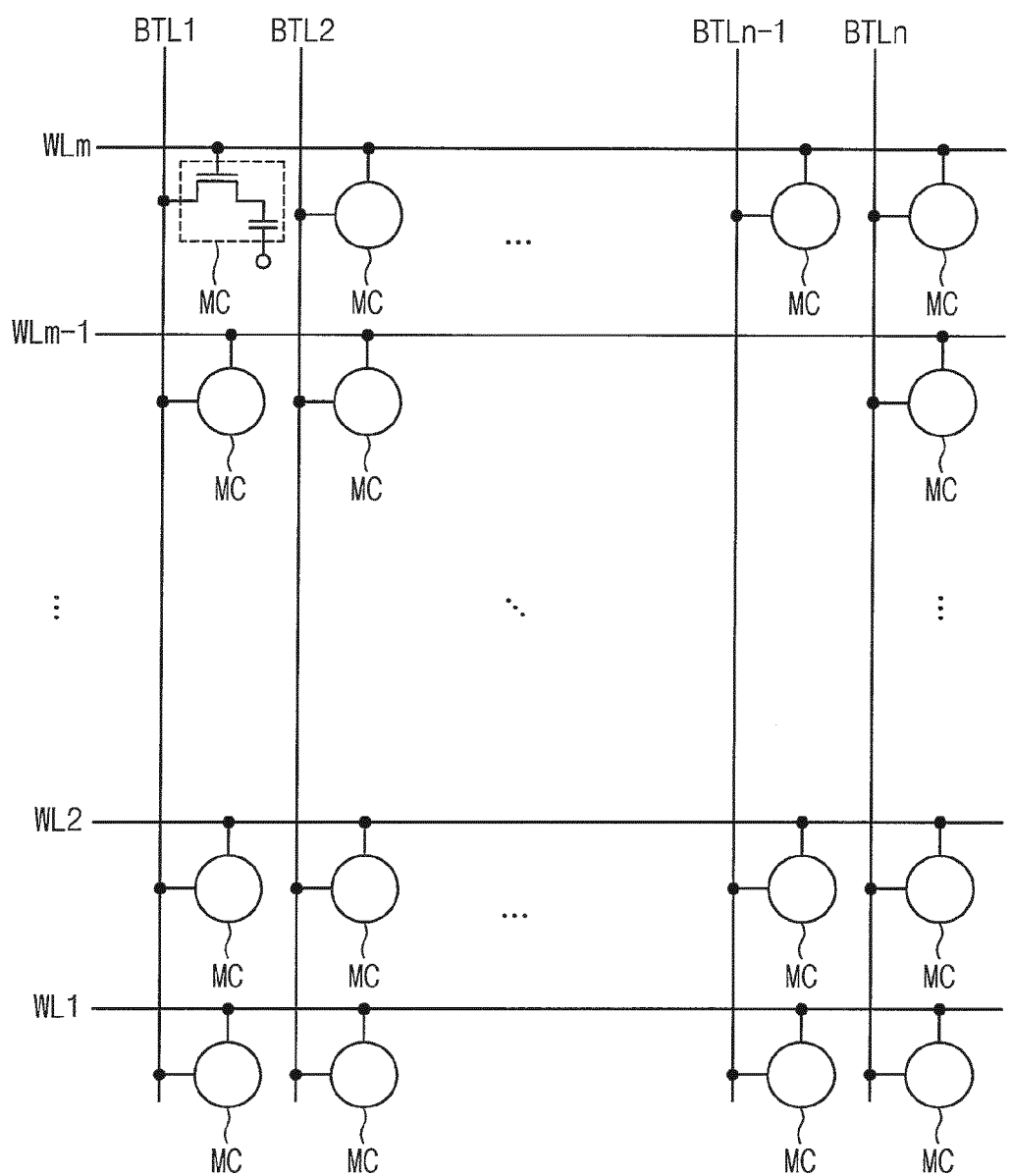
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 may include a plurality of word-lines WL1~WLm (m is a natural number greater than two), a plurality of bit-lines BTL1~BTLn (n is a natural number greater than two), and a plurality of volatile memory cells MCs disposed at intersections between the word-lines WL1~WLm and the bit-lines BTL1~BTLn. Each of the volatile memory cells MCs may include a cell transistor coupled to each of the word-lines WL1~WLm and each of the bit-lines BTL1~BTLn and a cell capacitor coupled to the cell transistor.

Figure 4:
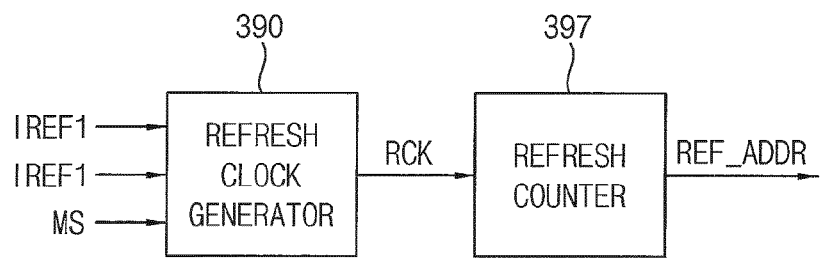
FIG. 4 is a block diagram illustrating an example of the refresh control circuit in the semiconductor memory device of FIG. 2 according to at least some example embodiments of the inventive concepts.

FIG. 4 is a block diagram illustrating an example of the refresh control circuit in the semiconductor memory device of FIG. 2 according to at least some example embodiments of the inventive concepts.

Referring to FIG. 4, the refresh control circuit 385 may include a refresh clock generator 390 and/or a refresh counter 397.

The refresh clock generator 390 may generate a refresh clock signal RCK in response to the first refresh control signal IREF1, the second refresh control signal IREF2 and the mode signal MS. The mode signal MS may determine a refresh period of a refresh operation. As described above, the refresh clock generator 390 may generate the refresh clock signal RCK whenever the refresh clock generator 390 receives the first refresh control signal IREF1 or during the second refresh control signal IREF2 is activated.

The refresh counter 397 may generate the refresh row address REF_ADDR designating sequentially the memory cell rows by performing counting operation at the period of the refresh clock signal RCK.

Figure 5:
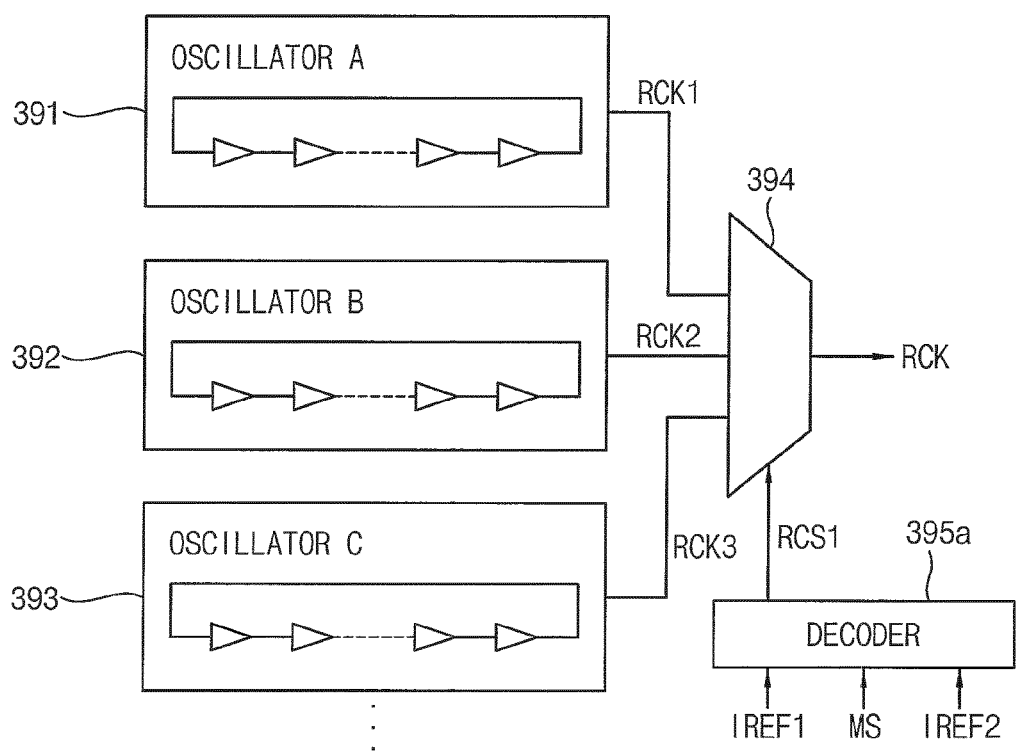
FIG. 5 is a circuit diagram illustrating an example of the refresh clock generator shown in FIG. 4 according to at least some example embodiments of the inventive concepts.

FIG. 5 is a circuit diagram illustrating an example of the refresh clock generator shown in FIG. 4 according to at least some example embodiments of the inventive concepts.

Referring to FIG. 5, a refresh clock generator 390a may include a plurality of oscillators 391, 392 and 393, a multiplexer 394 and/or a decoder 395a. The decoder 395a may decode the first refresh control signal IREF1, the second refresh control signal IREF2 and the mode signal MS to output a clock control signal RCS1. The oscillators 391, 392, and 393 generate refresh clock signals RCK1, RCK2 and RCK3 having different periods. The multiplexer 394 selects one of the refresh clock signals RCK1, RCK2 and RCK3 to provide the refresh clock signal RCK in response to the clock control signal RCS1.

Figure 6:
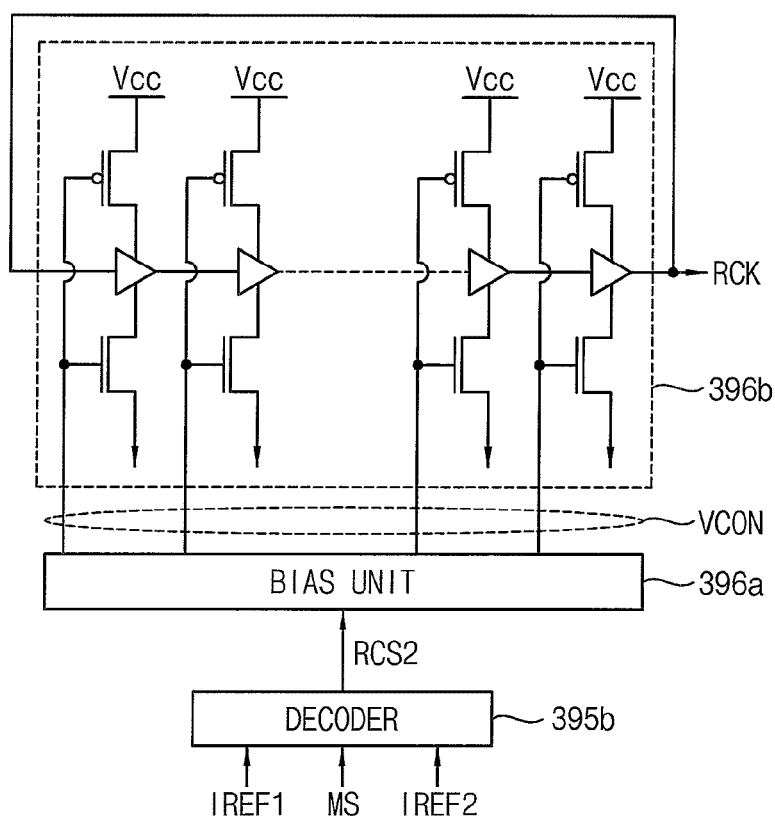
FIG. 6 is a circuit diagram illustrating another example of the refresh clock generator in FIG. 4 according to at least some example embodiments of the inventive concepts.

FIG. 6 is a circuit diagram illustrating another example of the refresh clock generator in FIG. 4 according to at least some example embodiments of the inventive concepts.

Referring to FIG. 6, a refresh clock generator 390b may include a decoder 395b, a bias unit 396a and/or an oscillator 396b. The decoder 395b may decode the first refresh control signal IREF1, the second refresh control signal IREF2 and the mode signal MS to output a clock control signal RCS2. The bias unit 396a generates a control voltage VCON in response to the clock control signal RCS2. The oscillator 396b generates the refresh pulse signal RCK having a variable period, according to the control voltage VCON.

Figure 7:
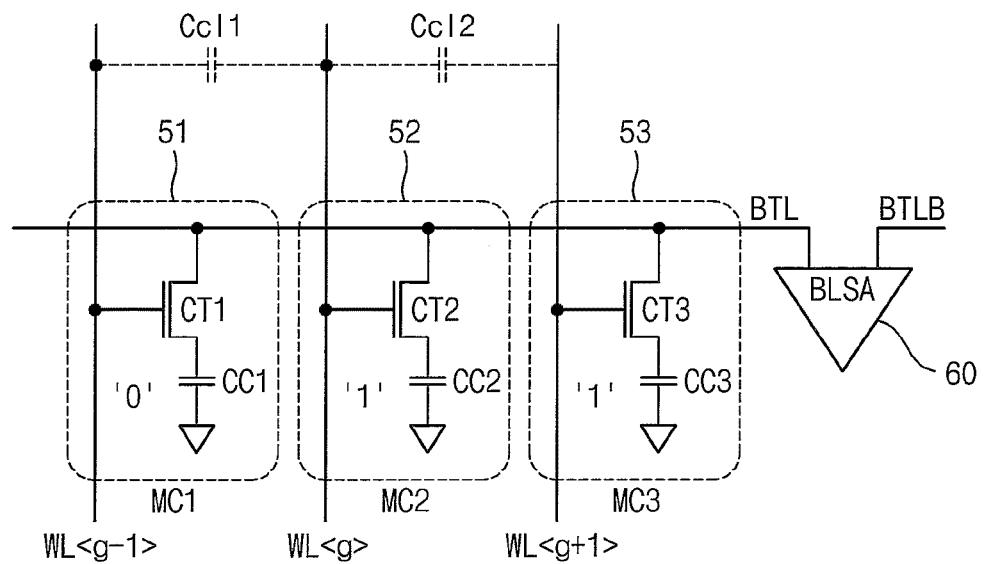
FIG. 7 is a circuit diagram illustrating disturbance between memory cells of a semiconductor memory device.

FIG. 7 is a circuit diagram illustrating disturbance between memory cells of a semiconductor memory device.

Referring to FIG. 7, a part of the semiconductor memory device 200 may include memory cells 51, 52, and 53 and/or a bit-line sense amplifier 60.

It is assumed that each of the memory cells 51, 52, and 53 is connected to the same bit-line BTL. In addition, the memory cell 51 is connected to a word-line WL<g−1>, the memory cell 52 is connected to a word-line WL<g>, and the memory cell 53 is connected to a word-line WL<g+1>. As shown in FIG. 7, the word-lines WL<g−1> and WL<g+1> are located adjacent to the word-line WL<g>. The memory cell 51 may include an access transistor CT1 and a cell capacitor CC1. A gate terminal of the access transistor CT1 is connected to the word-line WL<g−1> and its one terminal is connected to the bit-line BTL. The memory cell 52 may include an access transistor CT2 and a cell capacitor CC2. A gate terminal of the access transistor CT2 is connected to the word-line WL<g> and its one terminal is connected to the bit-line BTL. Also, the memory cell 53 may include an access transistor CT3 and a cell capacitor CC3. A gate terminal of the access transistor ST3 is connected to the word-line WL<g+1> and its one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier in a selected memory cell. During a read operation or a write operation, a select voltage (for example, Vpp) is provided to the word-line WL<g>. Then, due to capacitive coupling effect, a voltage of adjacent word-lines WL<g−1> and WL<g+1> rises even when no select voltage is applied. Such capacitive coupling is indicated with parasitic capacitances Cc11 and Cc21.

During a no refresh operation, when the word-line WL<g> is accessed repeatedly, charges stored in the cell capacitors CC1 and CC3 of the memory cells 51 and 53 connected to the word-lines WL<g−1> and WL<g+1> may leak gradually. In some example embodiments, the reliability of a logic '0' stored in the cell capacitor CC1 and a logic '1' stored in the cell capacitor CC3 may not be guaranteed. Therefore, the scrubbing operation on the memory cells is needed at an appropriate time.

Figure 8:
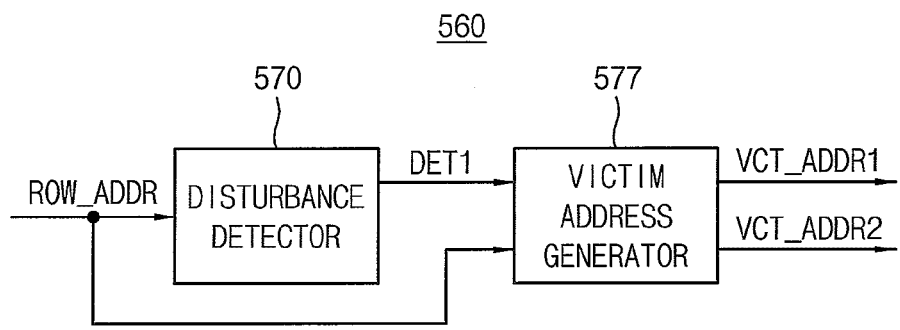
FIG. 8 is a block diagram illustrating an example of the victim address detector in the semiconductor memory device of FIG. 2 according to at least some example embodiments of the inventive concepts.

FIG. 8 is a block diagram illustrating an example of the victim address detector in the semiconductor memory device of FIG. 2 according to at least some example embodiments of the inventive concepts.

Referring to FIG. 8, the victim address detector 560 may include a disturbance detector 570 and/or a victim address generator 577.

The disturbance detector 570 may count a number of accesses to a first memory region (e.g., at least one memory cell row) based on the row address ROW_ADDR and may generate a first detection signal DET1 when the number of the counted accesses reaches a reference value during a reference (or predetermined or alternatively, desired) interval.

The victim address generator 577 may generate the at least one victim address VCT_ADDR1 and VCT_ADDR2 in response to the first detection signal DET1. The at least one victim address VCT_ADDR1 and VCT_ADDR2 may be a row address designating a second memory region and a third memory region which are located adjacent to the first memory region. The victim address generator 577 may provide the at least one victim address VCT_ADDR1 and VCT_ADDR2 to an address storing table in the scrubbing circuit 500.

Figure 9:
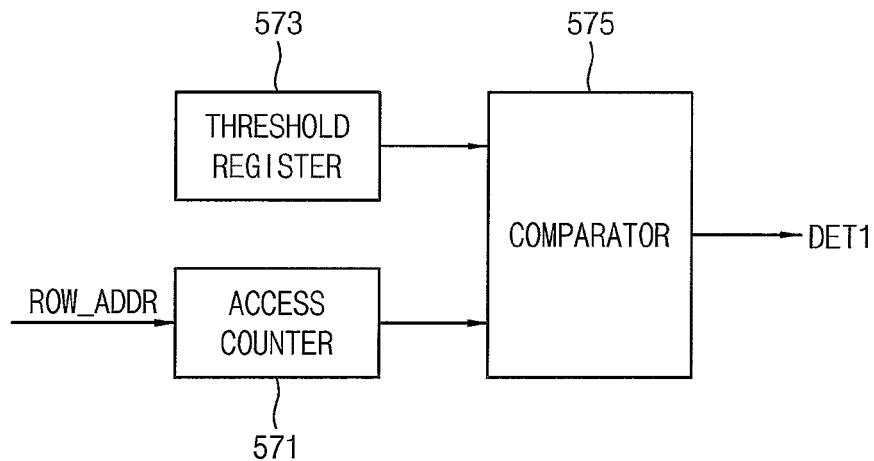
FIG. 9 is a block diagram illustrating the disturbance detector in the victim address detector of FIG. 8.

FIG. 9 is a block diagram illustrating the disturbance detector in the victim address detector of FIG. 8.

Referring to FIG. 9, the disturbance detector 570 may include access counter 571, a threshold register 573 and/or a comparator 575.

The access counter 571 may count a number of accesses to a specified address (or a specified memory region) based on the row address ROW_ADDR. For example, the access counter 571 may count a number of accesses to a specified word-line. The number of accesses may be counted on a specific word-line or a word-line group including at least two word-lines. Moreover, a count of the number of accesses may be performed by a specific block unit, a bank unit, or a chip unit.

The threshold register 573 may store a maximum disturbance occurrence count that guarantees the reliability of data in a specific word-line or a memory unit. For example, a threshold (or a reference value) on one word-line may be stored in the threshold register 573. Alternatively, a threshold on one word line group, one block, one bank unit, or one chip unit may be stored in the threshold register 573.

The comparator 575 may compare the reference value stored in the threshold register 573 with the number of accesses to a specific memory region counted by the access counter 571. If there is a memory region where the counted number of accesses reaches the reference value, the comparator 575 generates the first detection signal DET1. The comparator 575 provides the first detection signal DET1 to the victim address generator 577.

The victim address generator 577 receives the row address ROW_ADDR and generates the at least one victim address VCT_ADDR1 and VCT_ADDR2 in response to the first detection signal DET1.

Figure 10:
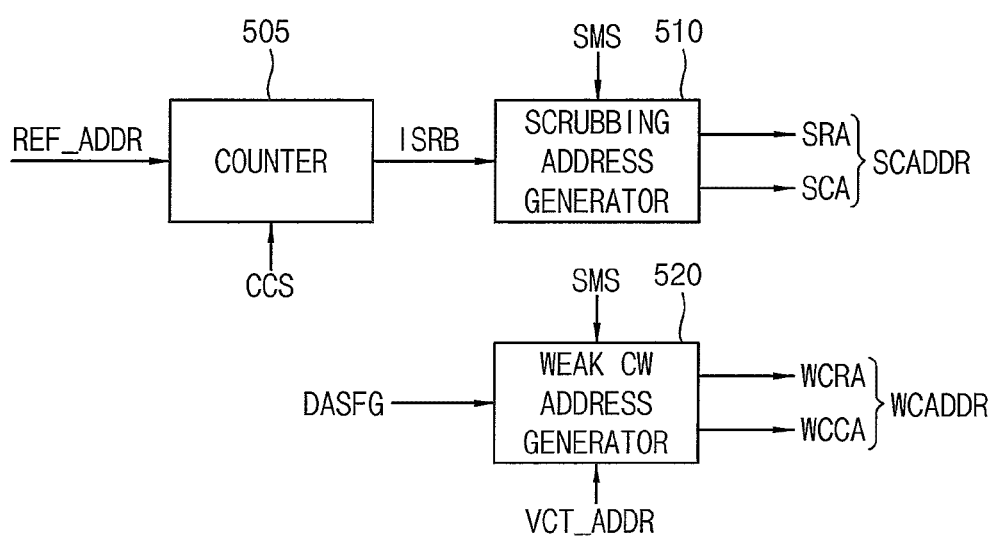
FIG. 10 is a block illustrating an example of the scrubbing circuit in the semiconductor memory device of FIG. 2 according to at least some example embodiments of the inventive concepts.

FIG. 10 is a block illustrating an example of the scrubbing circuit in the semiconductor memory device of FIG. 2 according to at least some example embodiments of the inventive concepts.

Referring to FIG. 10, the scrubbing circuit 500 may include a counter 505, a scrubbing address generator 510 and/or a weak codeword address generator 520.

The counter 505 counts the refresh row address REF_ADDR and generates an internal scrubbing signal ISRB which is activated during a first interval when the counter 505 counts the refresh row address REF_ADDR by a number designated by a counting control signal CCS. The first interval may correspond to a time interval for refreshing one memory cell row.

The scrubbing address generator 510 generates a normal scrubbing address SCADDR associated with a normal scrubbing operation for codewords in each of the memory cell rows, which gradually changes in the first scrubbing mode, in response to the internal scrubbing signal ISRB and the scrubbing mode signal SMS.

The normal scrubbing address SCADDR may include a scrubbing row address SRA and a scrubbing column address SCA. The scrubbing row address SRA designates one page in one bank array and the scrubbing column address SCA designates one of codewords in the one page. The scrubbing address generator 510 provides the scrubbing row address SRA to a corresponding row decoder and provides the scrubbing column address SCA to a corresponding column decoder.

The scrubbing operation performed based on the normal scrubbing address SCADDR may be referred to as a normal scrubbing operation because the scrubbing operation performed based on the normal scrubbing address SCADDR is performed on all codewords included in the memory cell array 300.

The weak codeword address generator 520 generates a weak codeword address WCADDR associated with a weak scrubbing operation associated with weak codewords in the bank array in a second scrubbing mode, in response to the scrubbing mode signal SMS. The weak codeword address WCADDR may include a weak codeword row address WCRA and a weak codeword column address WCCA. The scrubbing mode signal SMS indicates the first scrubbing mode when the scrubbing mode signal SMS has a first logic level and indicates the second scrubbing mode when the scrubbing mode signal SMS has a second logic level. The scrubbing mode signal SMS may be included in the third control signal CTL3.

The weak codeword address generator 520 provides the weak codeword row address WCRA to the corresponding row decoder and provides the weak codeword column address SCA to the corresponding column decoder.

The weak codeword address generator 520 may include an address storing table therein and the address storing table may store addresses of codewords associated with the victim address VCT_ADDR.

The scrubbing operation performed based on the weak codeword address WCADDR may be referred to as a weak scrubbing operation because the scrubbing operation performed based on the weak codeword address WCADDR is performed on weak codewords included in the memory cell array 300.

Figure 11:
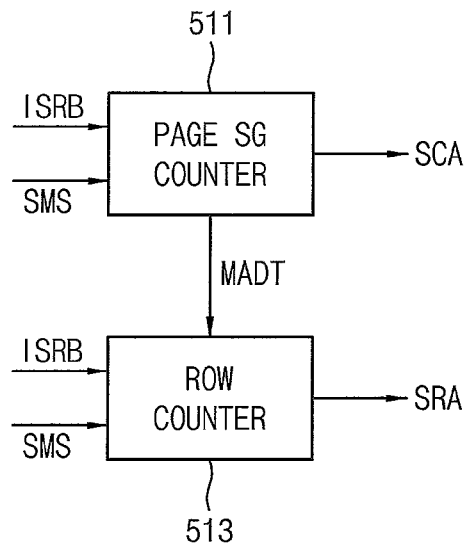
FIG. 11 is a block diagram illustrating the scrubbing address generator in the scrubbing circuit of FIG. 10 according to at least some example embodiments of the inventive concepts.

FIG. 11 is a block diagram illustrating the scrubbing address generator in the scrubbing circuit of FIG. 10 according to at least some example embodiments of the inventive concepts.

Referring to FIG. 11, the scrubbing address generator 510 may include a page segment counter 511 and a row counter 513.

The page segment counter 511 increases the scrubbing column address SCA by one during the internal scrubbing signal ISRB is activated in the first scrubbing mode and actives a maximum address detection signal MADT with being reset whenever the scrubbing column address SCA reaches its maximum value, in response to the internal scrubbing signal ISRB and the scrubbing mode signal SMS. The page segment counter 511 provides the maximum address detection signal MADT to the row counter 513.

The row counter 513 starts counting operation one receiving the internal scrubbing signal ISRB initially and increases the scrubbing row address SRA by one whenever the activated maximum address detection signal MADT in response to the internal scrubbing signal ISRB and the scrubbing mode signal SMS. Since the internal scrubbing signal ISRB is activated during the first interval while a refresh operation is performed on one memory cell row, the page segment counter 511 may generate the scrubbing column address SCA associated with codewords in one page during the first interval.

Figure 12:
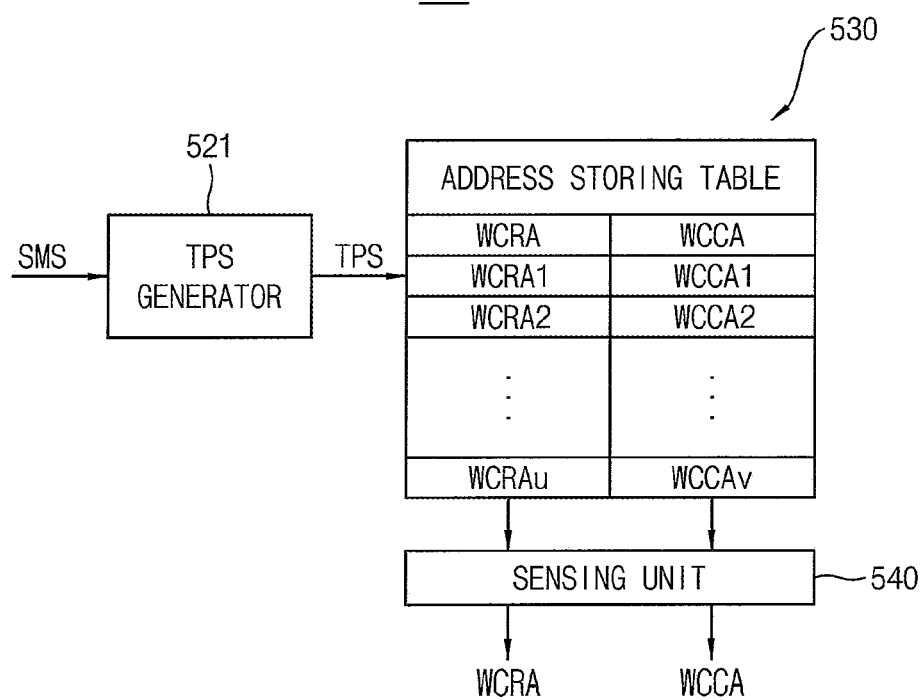
FIG. 12 illustrates the weak codeword address generator in the scrubbing circuit of FIG. 10 according to at least some example embodiments of the inventive concepts.

FIG. 12 illustrates the weak codeword address generator in the scrubbing circuit of FIG. 10 according to at least some example embodiments of the inventive concepts.

Referring to FIG. 12, the weak codeword address generator 520 may include a pointer signal (TPS) generator 521, an address storing table 530 and/or a sensing unit 540.

The address storing table 530 stores address information WCRA1~WCRAu and WCCA1~WCCAv (v is a positive integer greater than u) of weak codewords included in the memory cell array 300.

The weak codewords may be codewords in each of which an error bit is detected during the normal scrubbing operation or the normal read operation. The weak codewords may be all or some of a weak page including a number of error bit greater than a reference value among pages in each bank array of the memory cell array 300. In addition, the weak codewords may be codewords of neighbor pages adjacent to the intensively accessed memory region.

The pointer signal generator 521 may generate a pointer signal TPS which provide location information for the address storing table 530 in response to the scrubbing mode signal SMS during a refresh cycle, and provides the pointer signal TPS to the address storing table 530 with a second period.

The address storing table 530 may include a nonvolatile storage. The at least one victim address VCT_ADDR1 and VCT_ADDR2 provided from the victim address generator 577 in FIG. 8 may be stored in the address storing table 530.

The pointer signal TPS gradually increases with the second period during the refresh cycle and the address storing table 530 may output the weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. The sensing unit 540 provides the weak codeword row address WCRA to a corresponding row decoder and provides the weak codeword column address WCCA to a corresponding column decoder.

Figure 13:
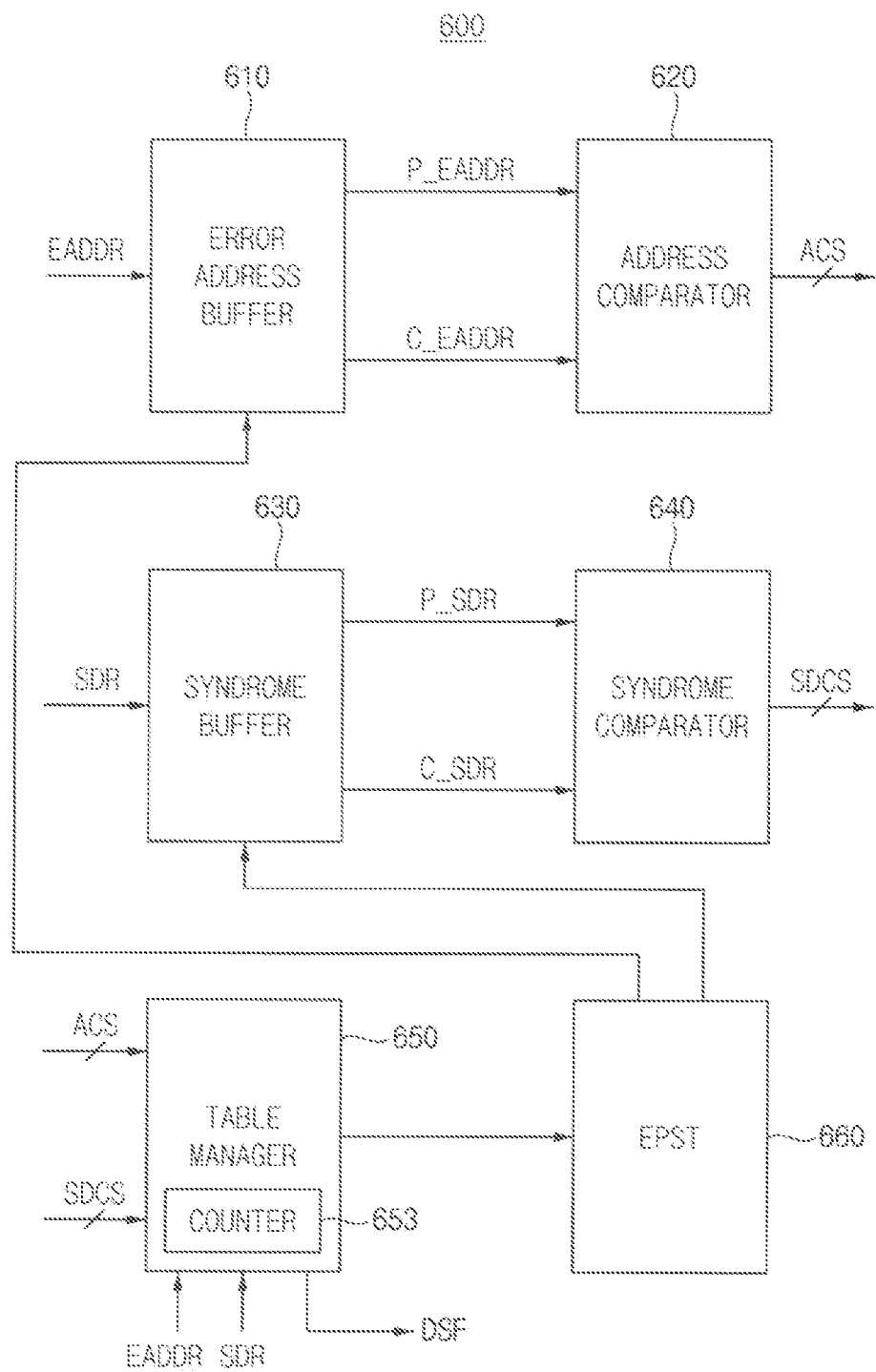
FIG. 13 is a block diagram illustrating an example of the row fault detector in the semiconductor memory device according to at least some example embodiments of the inventive concepts.

FIG. 13 is a block diagram illustrating an example of the row fault detector in the semiconductor memory device according to at least some example embodiments of the inventive concepts.

Referring to FIG. 13, the row fault detector 600 may include an error address buffer 610, an address comparator 620, a syndrome buffer 630, a syndrome comparator 640, a table manager 650 and an error parameter storing table (EPST) 660. The row fault detector 600 may be implemented by one or more circuits or circuitry. Accordingly, row fault detector 600 may also be referred to, in the present specification, as row fault detector circuitry 600. Circuitry of the row fault detector 600 may be configured, via hardware and/or software (e.g., firmware), to perform and/or control any operation described in the specification as being performed by a row fault detector or an element thereof.

The error parameter storing table 660 may store addresses of the plurality of defective memory cell rows as error addresses EADDR and may store the error parameter by accumulating the error parameter for each of the error addresses.

The error address buffer 610 may be connected to the error parameter storing table 660, may temporarily store the error address EADDR obtained through a current error detection operation and the error addresses which are pre-stored in the error parameter storing table 660, may provide the address comparator 620 with the error address obtained through the current error detection operation as a current error address C_EADDR and may provide the address comparator 620 with each of the error addresses which are pre-stored in the error parameter storing table 660 as a previous error address P_EADDR. The error address EADDR may include a row address of a defective memory cell row and a column address associated with a codeword in which the error is detected.

The address comparator 620 may compare the current error address C_EADDR with the previous error address P_EADDR to output an address comparison signal ACS, to the table manager 650, indicating that the current error address C_EADDR matches the previous error address P_EADDR based on a result of the comparison. Since the error address EADDR includes the row address of the defective memory cell row and the column address associated with the codeword in which the error is detected, the address comparison signal ACS may include information on change of a row address of the defective memory cell row and change of a column address associated with the codeword in which the error is detected.

The syndrome buffer 630 may be connected to the error parameter storing table 660, may temporarily store the syndrome SDR obtained through the current error detection operation and the syndromes which are pre-stored in the error parameter storing table 660, may provide the syndrome comparator 640 with the syndrome obtained through the current error detection operation as a current syndrome C_SDR and may provide the syndrome comparator 640 with each of the syndromes which are pre-stored in the error parameter storing table 660 as a previous syndrome P_SDR.

The syndrome comparator 640 may compare the current syndrome C_SDR with the previous syndrome P_SDR to output a syndrome comparison signal SDCS, to the table manager 650, indicating that the current syndrome C_SDR matches the previous syndrome P_SDR based on a result of the comparison.

The table manager 650 may selectively store the error address and the error parameter obtained through the current error detection operation in the error parameter storing table 660 based on the address comparison signal ACS and the syndrome comparison signal SDCS, and may record the number of changes in the error parameter storing table 660. The table manager 650 may include a counter 653 that counts the number of changes based on the address comparison signal ACS and the syndrome comparison signal SDCS, and may output the decoding status flag DSF when the number of changes is equal to or greater than a reference value. Although not illustrated, the table manager 650 may include a register that stores the reference value.

In example embodiments, the control logic circuit 210 in FIG. 2 may output the decoding status flag DSF based on the number of changes and the reference value stored in the table manager 650 instead of the table manager 650.

FIG. 14 is an example of the error parameter storing table in FIG. 13 when the error parameter corresponds to the syndrome according to at least some example embodiments of the inventive concepts.

Referring to FIG. 14, a plurality of indices Idx11, Idx12 and Idx13 of an error parameter storing table 660a may indicate entries that store error addresses EADDR, the syndrome SDR and number of changes CV of defective memory cell rows in each of which at least one error bit is detected.

The error parameter storing table 660a may include a plurality of columns 661, 662 and 663. Row addresses RAa, RAb and RAc of the defective memory cell rows may be stored in the column 661, change of the syndrome SDRa, SDRb1→SDRb2 and SDRc associated with each of the row addresses RAa, RAb and RAc may be stored in the column 662 and number of changes 1, 2 and 1 based on the change of the syndrome SDRa, SDRb1→SDRb2 and SDRc may be stored in the column 663.

In FIG. 14, it is noticeable that in the defective memory cell row designated by the row address RAb, the syndrome SDR is twice changed from SDRb1 to SDRb2 in the plurality of error detection operations.

FIG. 15 is an example of the error parameter storing table in FIG. 13 when the error parameter corresponds to the column address according to at least some example embodiments of the inventive concepts.

Referring to FIG. 15, a plurality of indices Idx21, Idx22 and Idx23 of an error parameter storing table 660b may indicate entries that store error addresses EADDR, the column address CA and number of changes CV of defective memory cell rows in each of which at least one error bit is detected.

The error parameter storing table 660b may include a plurality of columns 664, 665 and 666. Row addresses RAa, RAb and RAc of the defective memory cell rows may be stored in the column 664, change of the column address CAa, CAb1→CAb2 and CAc associated with each of the row addresses RAa, RAb and RAc may be stored in the column 665 and number of changes 1, 2 and 1 based on the change of the column address CAa, CAb1→CAb2 and CAc may be stored in the column 666.

In FIG. 15, it is noticeable that in the defective memory cell row designated by the row address RAb, the column address CA is twice changed from CAb1 to CAb2 in the plurality of error detection operations.

Figure 16:
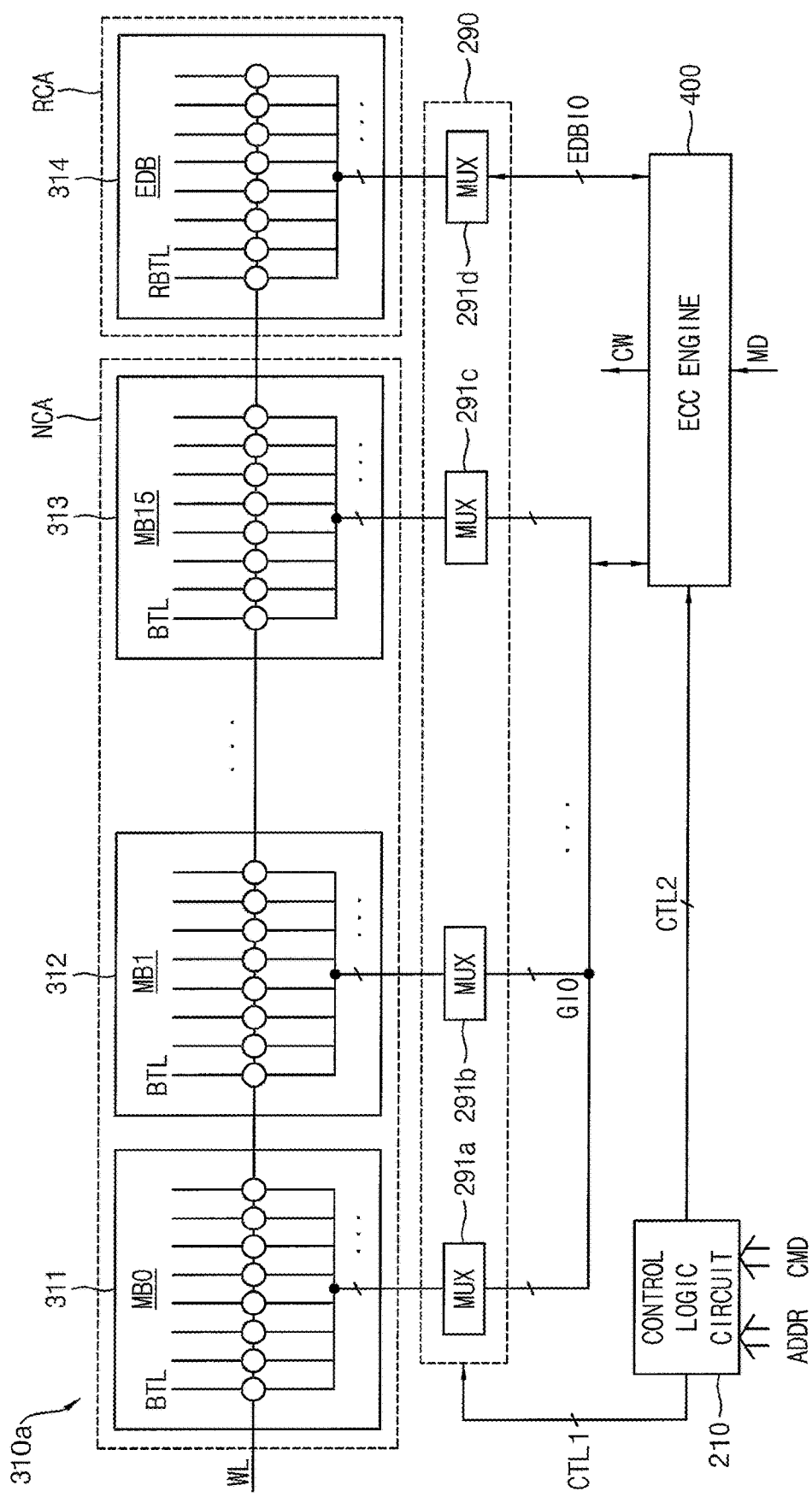
FIG. 16 illustrates a portion of the semiconductor memory device of FIG. 2 in a write operation.

FIG. 16 illustrates a portion of the semiconductor memory device of FIG. 2 in a write operation.

In FIG. 16, the control logic circuit 210, the first bank array 310, the I/O gating circuit 290 and the ECC engine 400 are illustrated.

Referring to FIG. 16, the first bank array 310 may include a normal cell array NCA and/or a redundancy cell array RCA.

The normal cell array NCA may include a plurality of first memory blocks MB0~MB15, e.g., 311~313, and the redundancy cell array RCA may include at least a second memory block 314. The first memory blocks 311~313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block.

In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 may include a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible.

The ECC engine 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the ECC engine 400.

When the command CMD is a write command, the control logic circuit 210 provides the second control signal CTL2 to the ECC engine 400 and the ECC engine 400 performs the ECC encoding on the main data MD to generate parity bits associated with the main data MD and provides the I/O gating circuit 290 with the codeword CW including the main data MD and the parity bits. The control logic circuit 210 provides the first control signal CTL1 to the I/O gating circuit 290 such that the codeword CW is to be stored in a sub-page of the target page in the first bank array 310.

Figure 17:
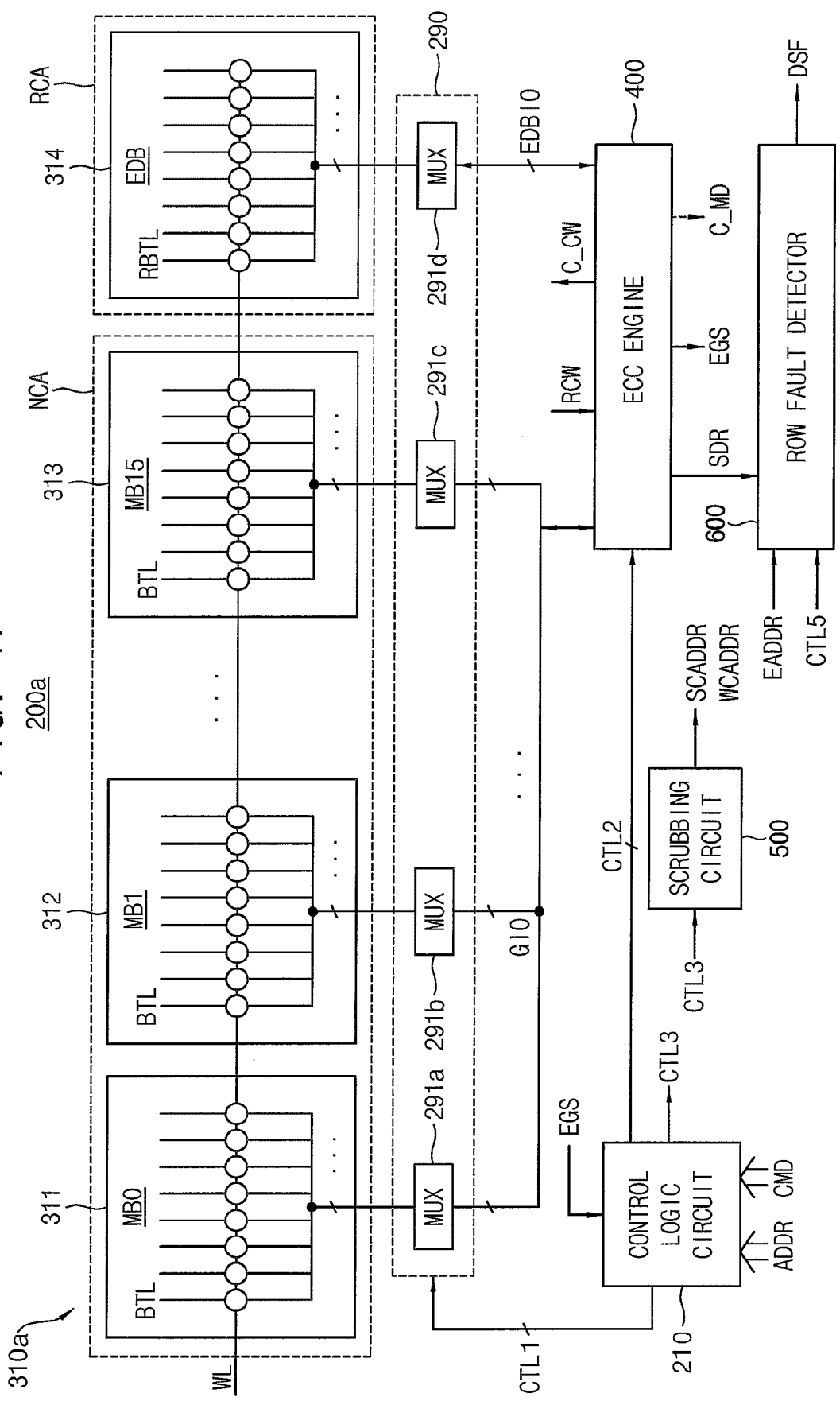
FIG. 17 illustrates a portion of the semiconductor memory device of FIG. 2 in a refresh operation or a normal read operation.

FIG. 17 illustrates a portion of the semiconductor memory device of FIG. 2 in a refresh operation or a normal read operation.

In FIG. 17, the control logic circuit 210, the first bank array 310, the I/O gating circuit 290, the ECC engine 400, the scrubbing circuit 500 and the row fault detector 600 are illustrated.

Referring to FIG. 17, when the command CMD is a refresh command (a first command) to designate a refresh operation, the control logic circuit 210 provides the first control signal CTL1 to the I/O gating circuit 290 such that a first (read) codeword RCW stored in each of sub-pages of the target page in the first bank array 310 is provided to the ECC engine 400.

In the refresh operation, the ECC engine 400 performs the ECC decoding on the codeword RCW based on the scrubbing addresses SCADDR and WCADDR from the scrubbing circuit 500. When the codeword RCW includes an error bit, the ECC engine 400 performs a normal scrubbing operation to correct the error bit and to write back the corrected main data in the sub-age The ECC engine 400 provides the error generation signal EGS to the control logic circuit 210 whenever the error bit is detected and provides the row fault detector 600 with the syndrome SDR associated with the codeword in which the error bit is detected. The control logic circuit 210 may provide the row fault detector 600 with an address of the codeword in which the error bit is detected as the error address EADDR based on the error generation signal EGS for one page.

The row fault detector 600 may store the error parameter associated with the defective memory cell rows by accumulating the error parameter based on the error address EADDR and the syndrome SDR, may determine whether the row fault occurs in each of the defective memory cell rows based on a number of changes of the error parameter stored therein and may output the decoding status flag DSF indicating that the row fault occurs.

When the command CMD corresponds to a read command, the ECC engine 400 may provide a corrected main data C_MD to the data I/O buffer 295.

Figure 18:
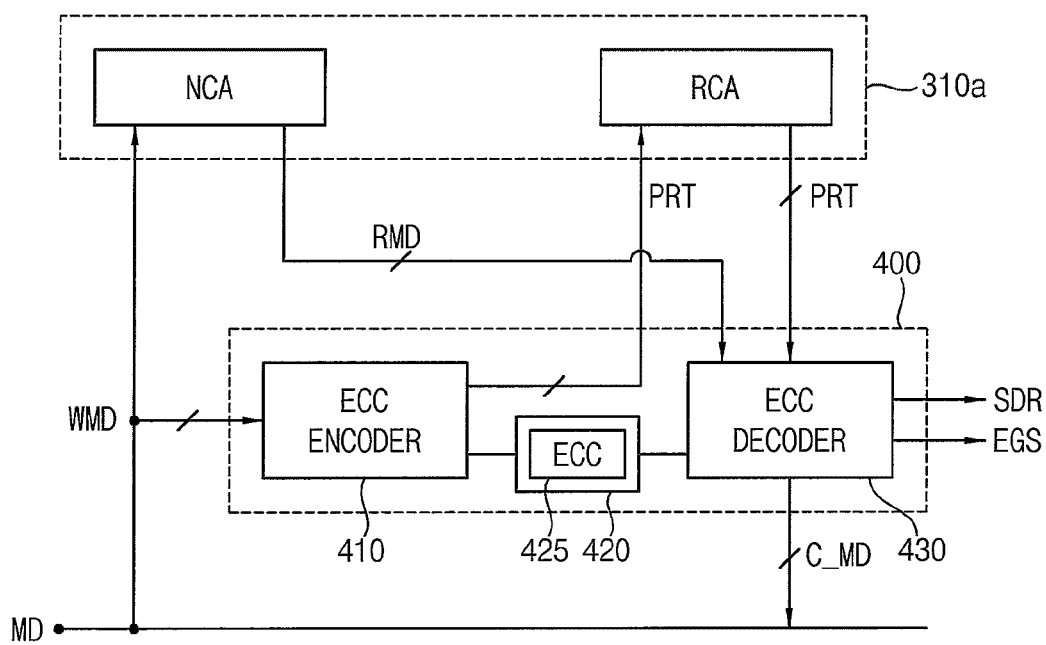
FIG. 18 is a block diagram illustrating an example of the ECC engine in the semiconductor memory device of FIG. 2 according to at least some example embodiments of the inventive concepts.

FIG. 18 is a block diagram illustrating an example of the ECC engine in the semiconductor memory device of FIG. 2 according to at least some example embodiments of the inventive concepts.

Referring to FIG. 18, the ECC engine 400 may include an ECC encoder 410, an ECC decoder 430 and/or an ECC memory 420. The ECC memory 420 may store an ECC 425. The ECC engine 400 may be implemented by one or more circuits or circuitry. Accordingly, the ECC engine 400 may also be referred to, in the present specification, as ECC engine circuitry 400. Circuitry of the ECC engine 400 may be configured, via hardware and/or software (e.g., firmware), to perform and/or control any operation described in the specification as being performed by an ECC engine or an element thereof.

The ECC encoder 410 is coupled to the ECC memory 420, and may generate parity bits PRT associated with a write data WMD to be stored in the normal cell array NCA of the first bank array 310. The parity bits PRT may be stored in the redundancy cell array RCA of the first bank array 310.

The ECC decoder 430 is coupled to the ECC memory 420. The ECC decoder 430 may perform an ECC decoding on a read data RMD based on the read data RMD and the parity bits PRT read from the first bank array 310. When the read data RMD includes at least one error bit as a result of the ECC decoding, the ECC decoder 430 provides the error generation signal EGS to the control logic circuit 210, provides the row fault detector 600 with the syndrome SDR associated with the codeword in which the error bit is detected, and corrects the error bit in the read data RMD to output the corrected main data C_MD.

Figure 19:
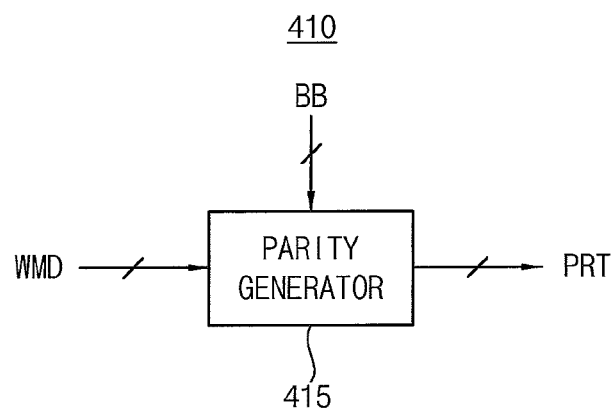
FIG. 19 illustrates an example of the ECC encoder in the ECC engine of FIG. 18 according to at least some example embodiments of the inventive concepts.

FIG. 19 illustrates an example of the ECC encoder in the ECC engine of FIG. 18 according to at least some example embodiments of the inventive concepts.

Referring to FIG. 19, the ECC encoder 410 may include a parity generator 415. The parity generator 415 receives the write data WMD and basis bit BB and generates the parity bits PRT by performing, for example, an XOR array operation. The basis bit BB is bits for generating the parity bits PRT with respect to the write data WMD and may include b'0000000. The basis bit BB may include other particular bits instead of b'0000000.

Figure 20:
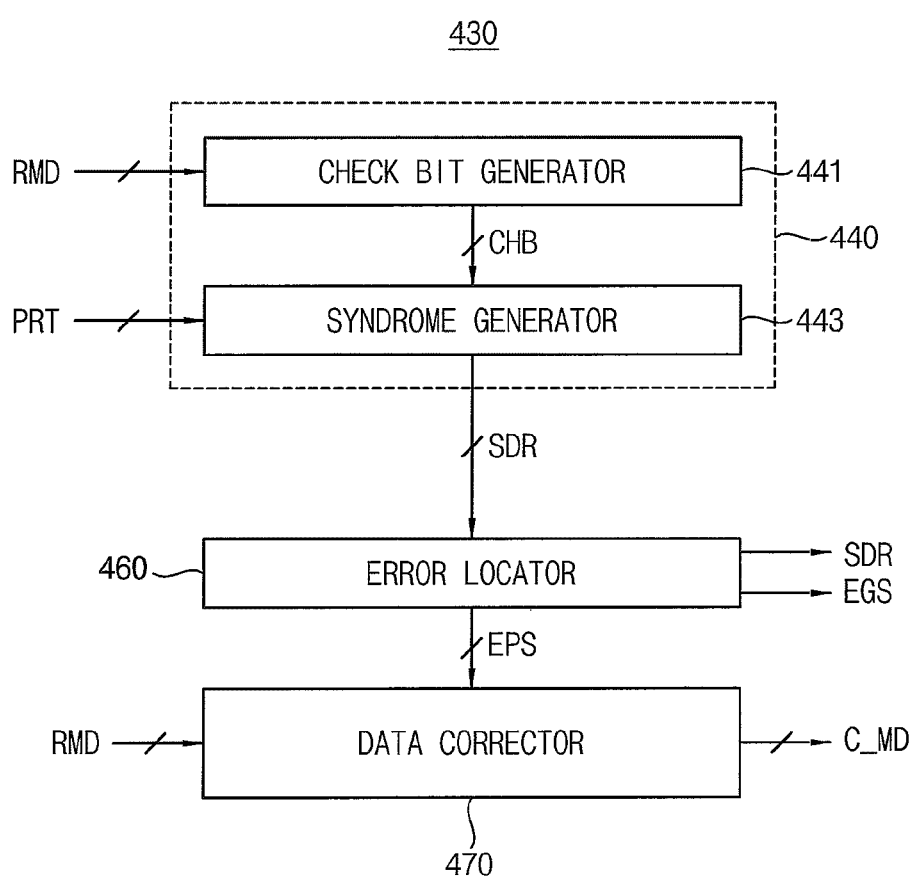
FIG. 20 illustrates an example of the ECC decoder in the ECC engine of FIG. 18 according to at least some example embodiments of the inventive concepts.

FIG. 20 illustrates an example of the ECC decoder in the ECC engine of FIG. 18 according to at least some example embodiments of the inventive concepts.

Referring to FIG. 20, the ECC decoder 430 may include a syndrome generation circuit 440, an error locator 460 and/or a data corrector 470. The syndrome generation circuit 440 may include a check bit generator 441 and/or a syndrome generator 443.

The check bit generator 441 generates check bits CHB based on the read data RMD by performing, an XOR array operation and the syndrome generator 443 generates a syndrome SDR by comparing corresponding bits of the parity bits PRT and the check bits CHB.

The error locator 460 generates an error position signal EPS indicating a position of an error bit in the read data RMD to provide the error positon signal EPS to the data corrector 470 when all bits of the syndrome SDR are not s a syndrome addition, when the read data RMD includes the error bit, the error locator 460 providers the error generation signal EGS to the control logic circuit 210, and provides the row fault detector 600 with the syndrome SDR associated with the codeword in which the error bit is detected. In the present specification, the error locator 460 may also be referred to as error locator circuitry 460 and the data corrector 470 may also be referred to as data corrector circuitry 470.

The data corrector 470 receives the read data RMD, corrects the error bit in the read data RMD based on the error position signal EPS when the read data RMD includes the error bit and outputs the corrected main data C_MD.

Figure 21A:
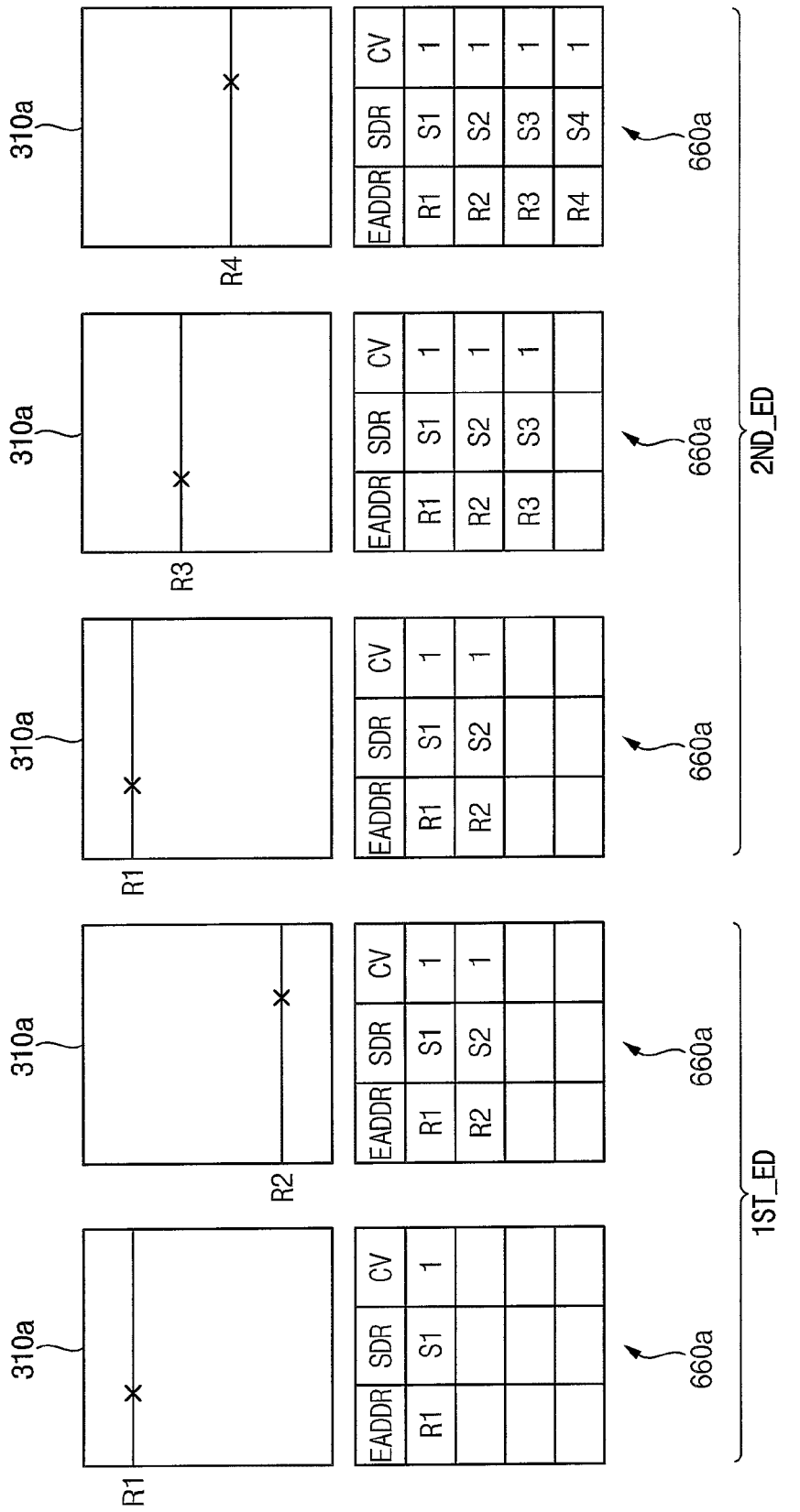

FIGS. 21A and 21B illustrate an example of operation of the row fault detector in FIG. 13 according to at least some example embodiments of the inventive concepts.

In FIGS. 21A and 21B, there are illustrated the first bank array 310*a* and the error parameter storing table 660*a* when the error parameter corresponds to the syndrome.

Referring to FIGS. 21A and 21B, a defective row address R1 in which the error bit is detected, a syndrome S1 associated with the defective row address R1, a defective row address R2 in which the error bit is detected and a syndrome S2 associated with the defective row address R2 are initially recorded in the error parameter storing table 660*a* based on a first error detection operation 1ST_ED. Therefore, the number of changes CV for the syndromes S1 and S2 are recorded as '1' and '1'.

A defective row address R3 in which the error bit is detected, a syndrome S3 associated with the defective row address R3, a defective row address R4 in which the error bit is detected and a syndrome S4 associated with the defective row address R4 are initially recorded in the error parameter storing table 660*a* based on a second error detection operation 2ND_ED. Therefore, the number of changes CV for the syndromes S3 and S4 are recorded as the number and the number of changes CV for the syndromes S1 and S2 are maintained as '1' and '1'.

Since, the syndrome S4 is changed to a syndrome S5 associated the defective row address R4 based on (M−1)-th error detection operation (M−1)th_ED, the syndrome S5 associated the defective row address R4 is recorded in the error parameter storing table 660*a* and the number of changes CV for the syndrome S5 is recorded as address R4 is recorded in the error parameter storing table 660*a* defective row address R1, a defective row address R2 in which the error bith_ED, the syndrome S6 associated the defective row address R4 is recorded in the error parameter storing table 660a and the number of changes CV for the syndrome S6 is recorded as '3'.

Figure 22A:
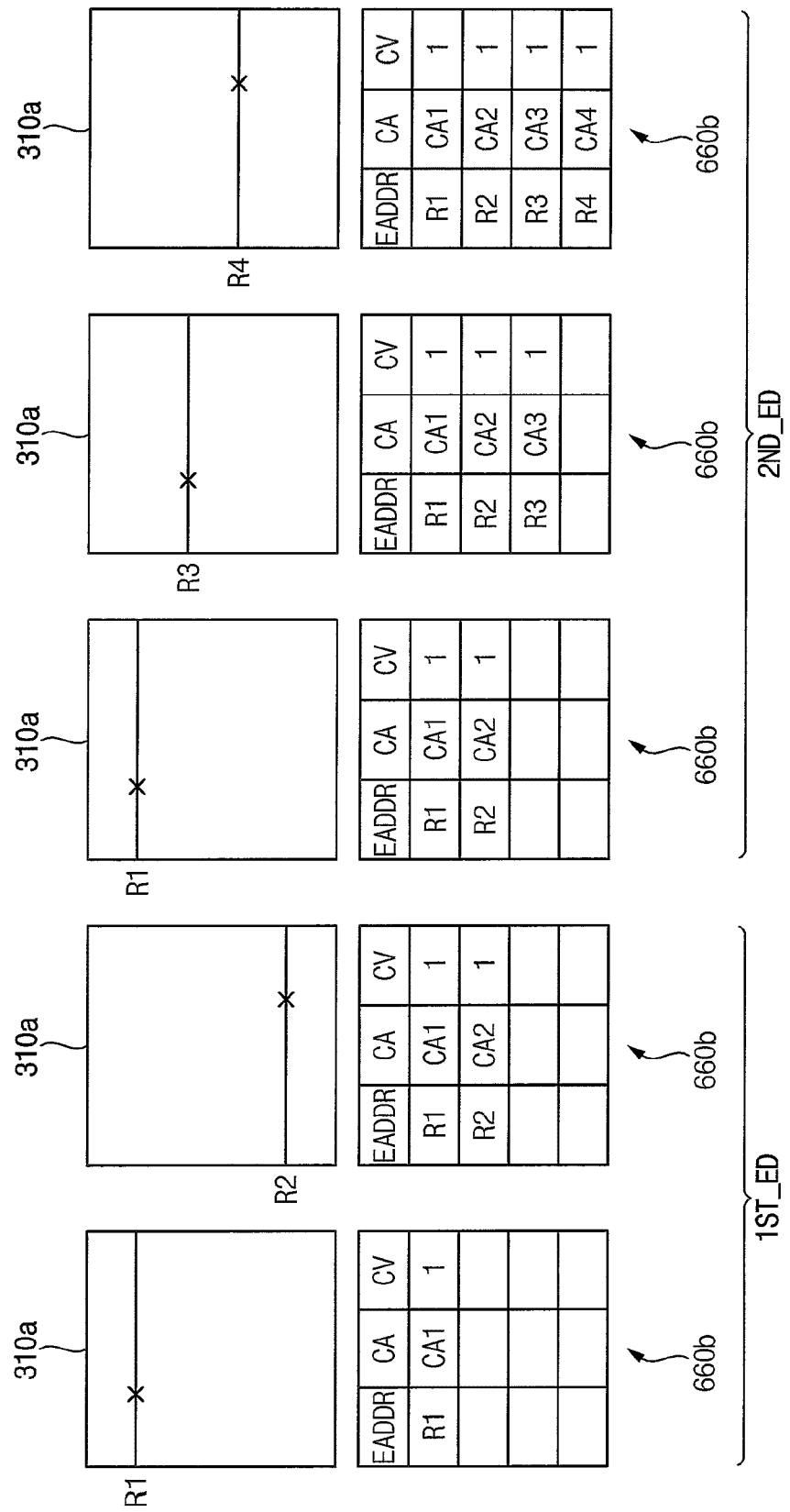
FIGS. 22A and 22B illustrate an example of operation of the row fault detector in FIG. 13 according to at least some example embodiments of the inventive concepts.
Figure 22B:
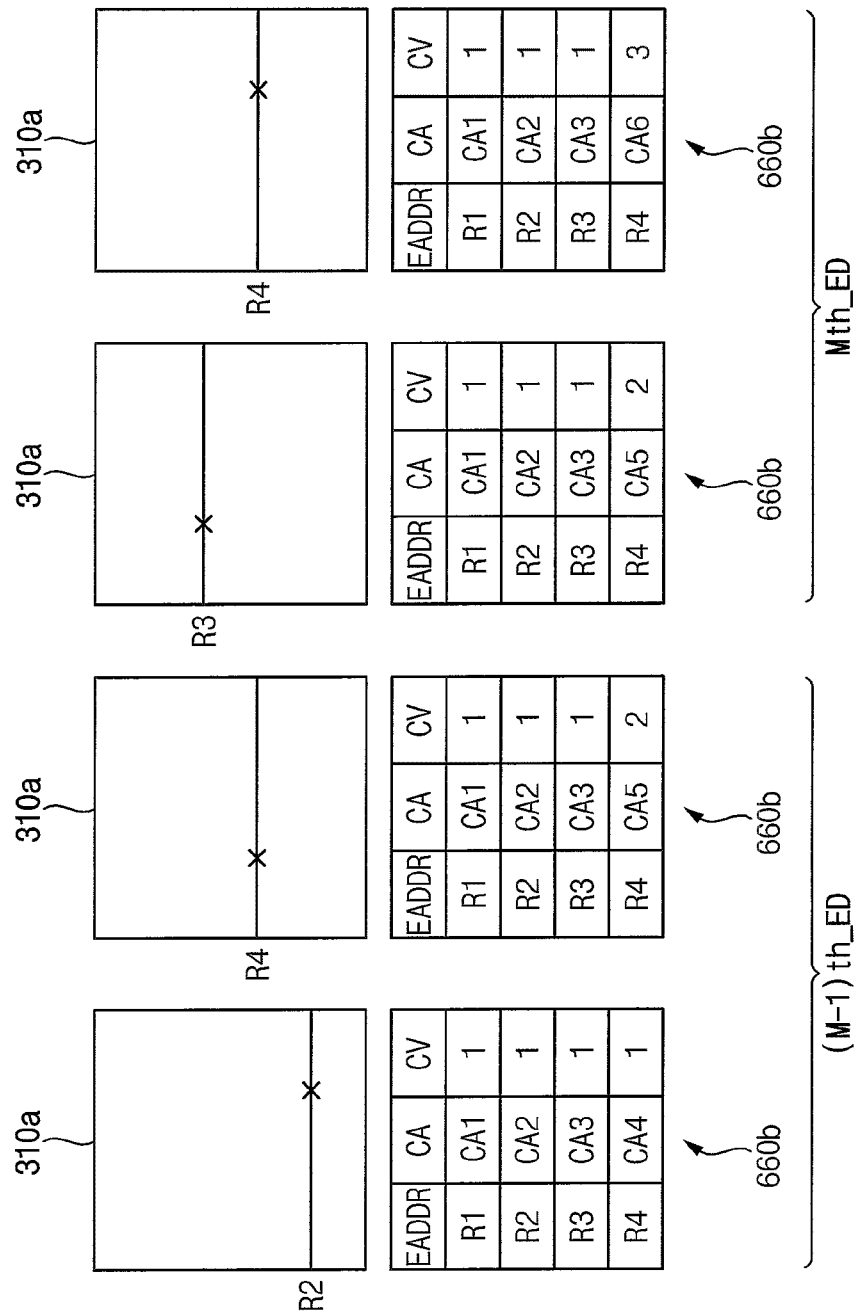

FIGS. 22A and 22B illustrate an example of operation of the row fault detector in FIG. 13 according to at least some example embodiments of the inventive concepts.

In FIGS. 22A and 22B, there are illustrated the first bank array 310a and the error parameter storing table 660b when the error parameter corresponds to the column address.

Referring to FIGS. 22A and 22B, a defective row address R1 in which the error bit is detected, a column address CA1 associated with the defective row address R1, a defective row address R2 in which the error bit is detected and a column address CA2 associated with the defective row address R2 are initially recorded in the error parameter storing table 660b based on a first error detection operation 1ST_ED. Therefore, the number of changes CV for the column addresses CA1 and CA2 are recorded as Therefore, A defective row address R3 in which the error bit is detected, a column address CA3 associated with the defective row address R3, a defective row address R4 in which the error bit is detected and a column address CA4 associated with the defective row address R4 are initially recorded in the error parameter storing table 660b based on a second error detection operation 2ND_ED. Therefore, the number of changes CV for the column addresses CA3 and CA4 are recorded as error detection operation 2ND_ED. Therefore, the column addresses CA1 and CA2 are maintained as error detection Since the column address CA4 is changed to a column address CA5 associated the defective row address R4 based on (M−1)-th error detection operation (M−1)th_ED, the column address CA5 associated the defective row address R4 is recorded in the error parameter storing table 660b and the number of changes CV for the column address CA5 recorded as s CA5 changes CV column address CA5 is changed to a column address CA6 associated the defective row address R4 based on M-th error detection operation Mth_ED, the column address CA6 associated the defective row address R4 is recorded in the error parameter storing table 660b and the number of changes CV for the column address CA6 is recorded as A6 ch In FIGS. 21A through 22B, when the reference value associated with the number of changes CV is rameter storing table 660_ED600 may transmit the decoding status flag DSF indicating that the row fault occurs in the memory cell row designated by the defective row address R4 to the memory controller 100.

In FIGS. 21A through 22B, when a first row address of a first error address obtained through one of the plurality of error detection operations does not match respective one of row addresses of error addresses stored in the error parameter storing table, the table manager 650 in FIG. 13 may store the first row address and a first error parameter associated with the first row address in the error parameter storing table 660.

In addition, when all entries of the error parameter storing table 660 are full and the table manager 650 is to store a second error address which does not match respective one of the error addresses stored in the error parameter storing table 660 and a second error parameter in the error parameter storing table 660, the table manager 650 may store the second address and the second error parameter in an entry associated with an error address with a minimum of the number of the changes CV.

Figure 23:
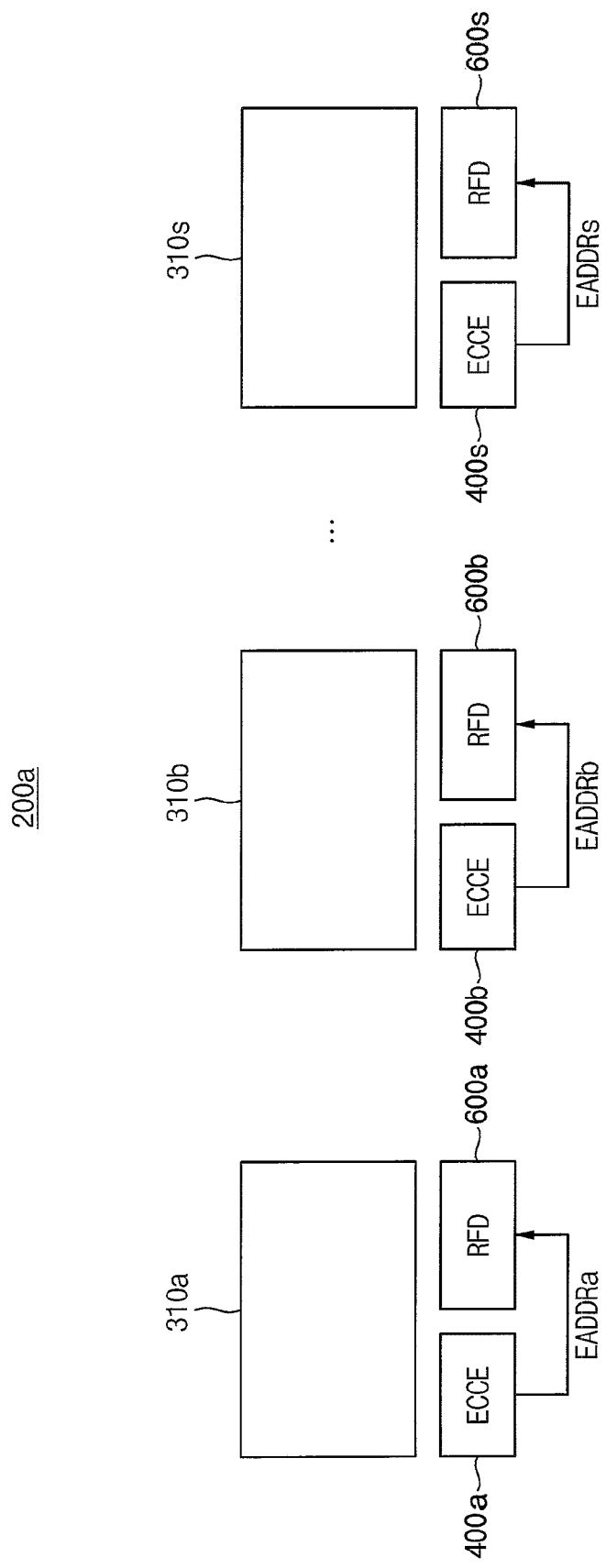
FIG. 23 is a block diagram illustrating a semiconductor memory device according to at least some example embodiments of the inventive concepts.

FIG. 23 is a block diagram illustrating a semiconductor memory device according to at least some example embodiments of the inventive concepts.

Referring to FIG. 23, a semiconductor memory device 200a is illustrated. The semiconductor memory device 200a may include a plurality of bank arrays 310a~310s, a plurality of bank ECC engines 400a~400s corresponding to the plurality of bank arrays 310a~310s and a plurality of bank row fault detectors 600a~600s corresponding to the plurality of bank arrays 310a~310s. The plurality of bank ECC engines 400a~400s may correspond to the ECC engine 400 in FIG. 2 and the plurality of bank row fault detectors 600a~600s may correspond to the row fault detector 600 in FIG. 2.

Each of the plurality of bank ECC engines 400a~400s may provide respective one of the plurality of bank row fault detectors 600a~600s with respective one of error addresses EADDRa~EADDRs associated with defective memory cell rows in each of which at least one error bit is detected in at least a portion of a plurality of error detection operations and the each of the bank row fault detectors 600a~600s may perform row fault detection operation on respective one of the plurality of bank arrays 310a~310s independently from one another based on respective one of the error addresses EADDRa~EADDRs.

Figure 24:
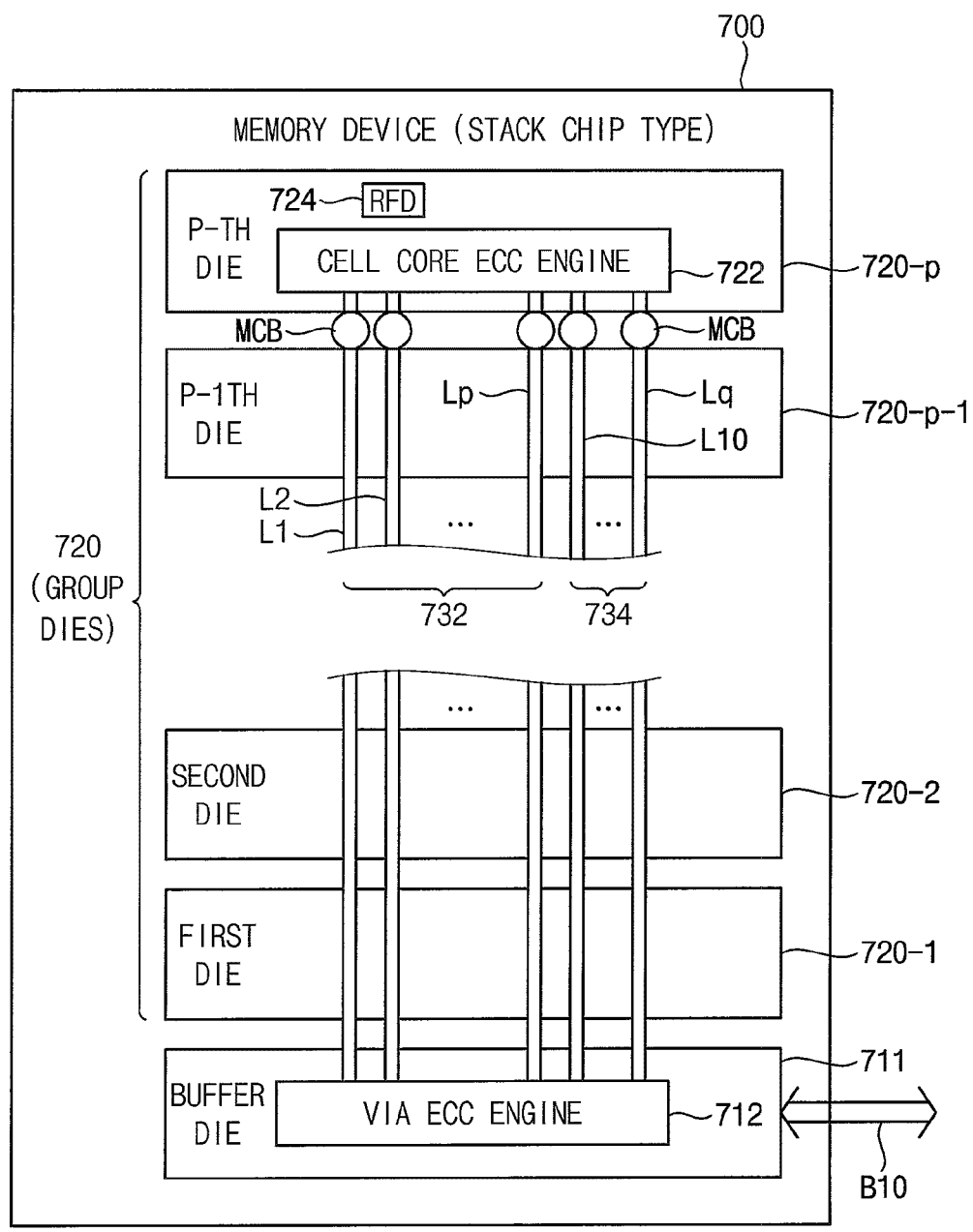
FIG. 24 is a block diagram illustrating a semiconductor memory device according to at least some example embodiments of the inventive concepts.

FIG. 24 is a block diagram illustrating a semiconductor memory device according to at least some example embodiments of the inventive concepts.

Referring to FIG. 24, a semiconductor memory device 700 may include at least one buffer die 711 and/or group dies 720 providing a soft error analyzing and correcting function in a stacked chip structure.

The group dies 720 may include a plurality of memory dies 720-1 to 720-p which is stacked on the at least one buffer die 711 and conveys data through a plurality of through silicon via (TSV) lines.

Each of the memory dies 720-1 to 720-p may include a cell core ECC engine 722 which generates transmission parity bits (e.g., transmission parity data) based on transmission data to be sent to the at least one buffer die 711 and a row fault detector (RFD) 724. The cell core ECC engine 722 may employ the ECC engine 400 of FIG. 18. The row fault detector 724 may employ the row fault detector 600 of FIG. 13.

The cell core ECC engine 722 may provide the row fault detector 724 with error addresses and syndromes obtained through a plurality of error detection operations, the row fault detector 724 may store the error addresses and the syndromes by accumulating the error addresses and the syndromes and may determine whether a row fault occur in each of defective memory cell rows based on the error addresses and a number of changes of the syndromes.

The at least one buffer die 711 may include a via ECC engine 712 which corrects a transmission error using the transmission parity bits when a transmission error is detected from the transmission data received through the TSV liens and generates error-corrected data.

The semiconductor memory device 700 may be a stack chip type memory device or a stacked memory device which conveys data and control signals through the TSV lines. The TSV lines may be also called 'through electrodes'.

The cell core ECC engine 722 may perform error correction on data which is outputted from the memory die 720-p before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

A data TSV line group 732 which is formed at one memory die 720-$p$ may include TSV lines L1 to Lp, and a parity TSV line group 734 may include TSV lines L10 to Lq. The TSV lines L1 to Lp of the data TSV line group 732 and the parity TSV lines L10 to Lq of the parity TSV line group 734 may be connected to micro bumps MCB which are correspondingly formed among the memory dies 720-1 to 720-$p$.

Each of the memory dies 720-1 to 720-$p$ may include DRAM cells each including at least one access transistor and one storage capacitor.

The semiconductor memory device 700 may have a three-dimensional (3D) chip structure or a 2.5D chip structure to communicate with the host through a data bus B10. The at least one buffer die 711 may be connected with the memory controller through the data bus B10.

The cell core ECC engine 722 may output transmission parity bits as well as the transmission data through the parity TSV line group 734 and the data TSV line group 732 respectively. The outputted transmission data may be data which is error-corrected by the cell core ECC engine 722.

The via ECC engine 712 may determine whether a transmission error occurs at the transmission data received through the data TSV line group 732, based on the transmission parity bits received through the parity TSV line group 734. When a transmission error is detected, the via ECC engine 712 may correct the transmission error on the transmission data using the transmission parity bits. When the transmission error is uncorrectable, the via ECC engine 712 may output information indicating occurrence of an uncorrectable data error.

When an error is detected from read data in a high bandwidth memory (HBM) or the stacked memory structure, the error is an error occurring due to noise while data is transmitted through the TSV.

According to at least some example embodiments of the inventive concepts, as illustrated in FIG. 24, the cell core ECC engine 722 may be included in the memory die, the via ECC engine 712 may be included in the at least one buffer die 711. Accordingly, it may be possible to detect and correct soft data fail. The soft data fail may include a transmission error which is generated due to noise when data is transmitted through TSV lines.

Figure 25:
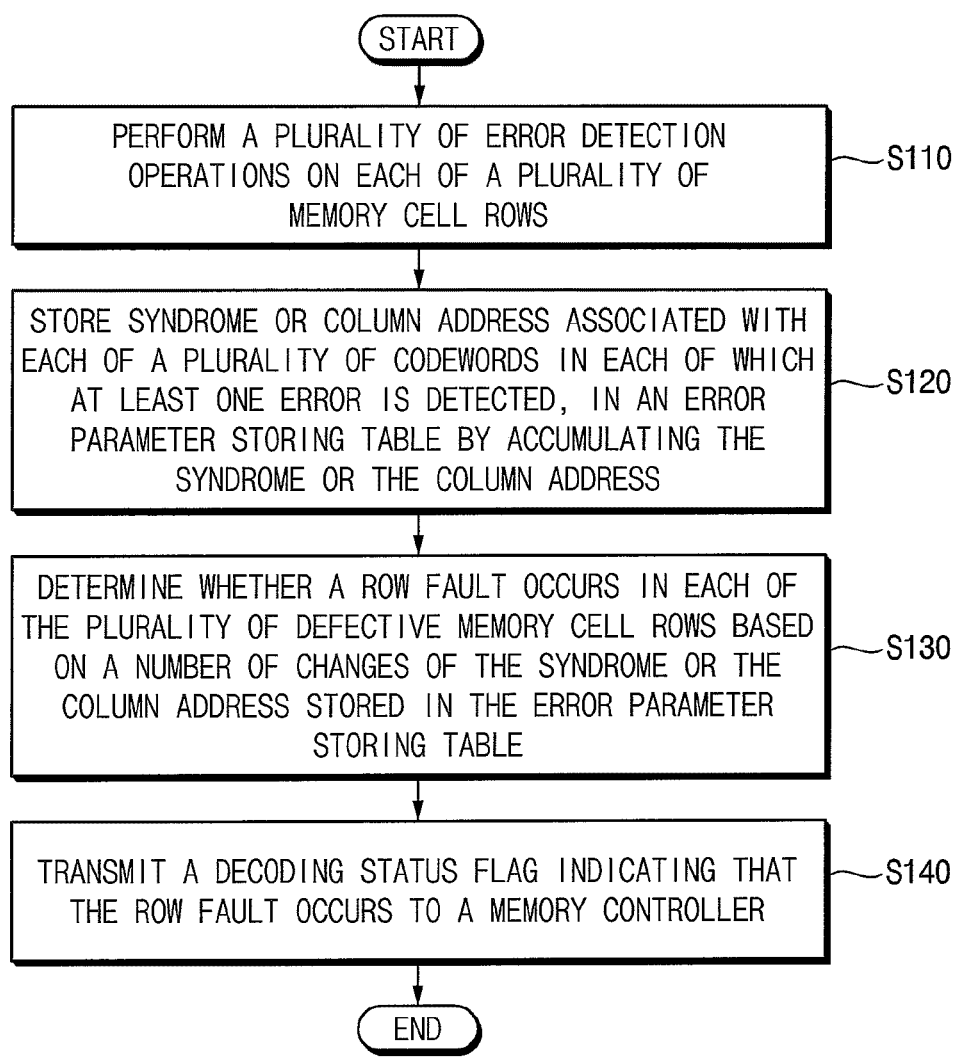
FIG. 25 is a flow chart illustrating a method of a semiconductor memory device according to at least some example embodiments of the inventive concepts.

FIG. 25 is a flow chart illustrating a method of a semiconductor memory device according to at least some example embodiments of the inventive concepts.

Referring to FIGS. 2 through 25, in a method of operating a semiconductor memory device 200 including a memory cell array 300 which may include a plurality of memory cell rows and each of the plurality of memory cell rows may include a plurality of volatile memory cells, the ECC engine 400 performs, a plurality of error detection operations on respective one of the plurality of memory cell rows (operation S110).

The control logic circuit 210 stores syndrome or column address associated with each of a plurality of codewords in each of which at least one error is detected during the plurality of error detection operations, in the error parameter storing table 660 by accumulating the syndrome or the column address for each of a plurality of defective memory cell rows in each of which the at least one error is detected (operation S120).

The table manager 650 (or the row fault detector 600), determines whether a row fault occurs in each of the plurality of defective memory cell rows based on a number of changes of the syndrome or the column address stored in the error parameter storing table 660 (operation S130).

When the row fault occurs, the table manager 650 transmits a decoding status flag DSF indicating that the row fault occurs to the memory controller 100 (operation S140).

Figure 26:
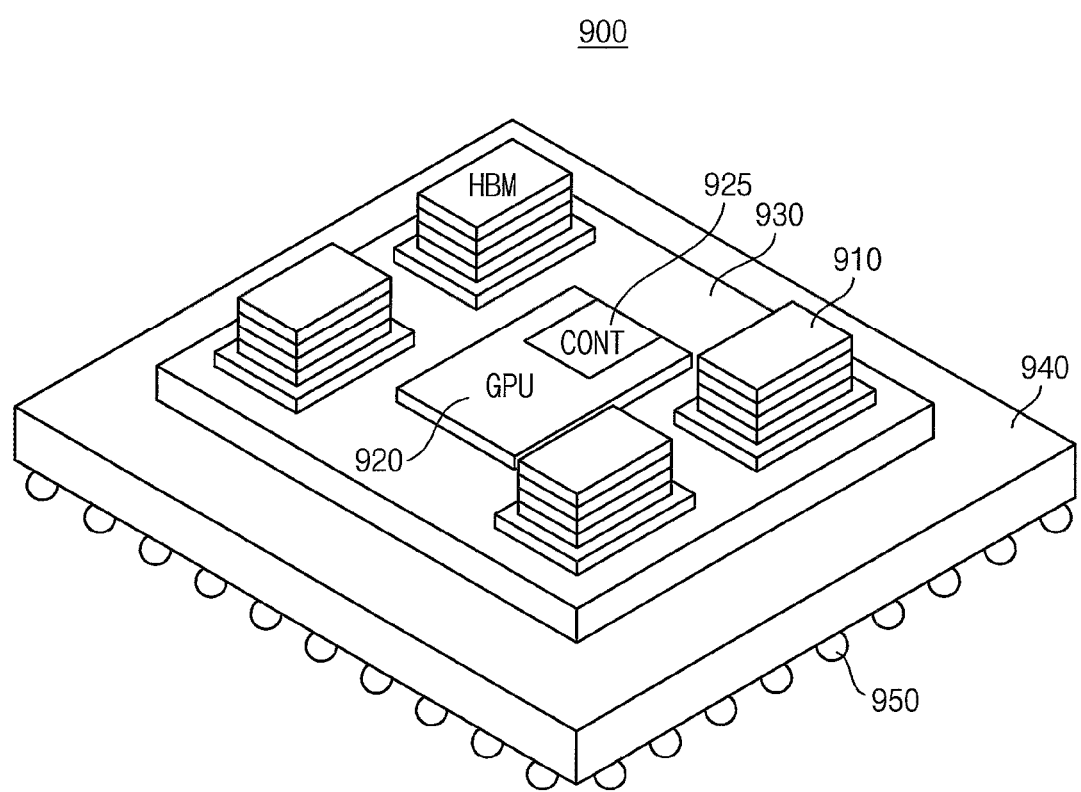
FIG. 26 is a diagram illustrating a semiconductor package including the stacked memory device, according to at least some example embodiments of the inventive concepts.

FIG. 26 is a diagram illustrating a semiconductor package including the stacked memory device, according to at least some example embodiments of the inventive concepts.

Referring to FIG. 26, a semiconductor package 900 may include one or more stacked memory devices 910 and/or a graphic processing unit (GPU) 920. The GPU 920 may include a memory controller (CONT) 925.

The stacked memory devices 910 and the GPU 920 may be mounted on an interposer 930, and the interposer on which the stacked memory devices 910 and the GPU 920 are mounted may be mounted on a package substrate 940. The package substrate 940 may be mounted on solder balls 950. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. Each of the memory dies may include a memory cell array, an ECC engine and/or a scrubbing circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to at least some example embodiments of the inventive concepts, the semiconductor memory device may include a control logic circuit, an ECC engine and a row fault detector. The control logic circuit control the row fault detector to store error addresses of defective memory cell rows and error parameter associated with codewords in which the error is detected therein by accumulating the error addresses and the error parameter. The row fault detector may determine whether a row fault occurs in each of the defective memory cell rows based on a number of changes of the error parameter. Therefore, the semiconductor memory device may determine whether each of the defective memory cell rows has single bit error or a row fault based on the number of changes.

Aspects of the present disclosure may be applied to systems using semiconductor memory devices that employ volatile memory cells and an ECC engine. For example, aspects of the present disclosure may be applied to systems such as be a smart phone, a navigation system, a notebook computer, a desk top computer and a game console that use the semiconductor memory device as a working memory.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A semiconductor memory device comprising:
   a memory cell array including a plurality of memory cell rows, each of the plurality of memory cell rows including volatile memory cells;
   error correction code (ECC) engine circuitry;
   row fault detector circuitry; and
   control logic circuitry configured to control the ECC engine circuitry to perform a plurality of error detection operations on respective one of the plurality of memory cell rows,
   wherein the control logic circuitry is configured to control the row fault detector circuitry to,
      store an error parameter associated with each of a plurality of codewords in each of which at least one error is detected during the plurality of error detection operations, and
      accumulate the error parameter for each of a plurality of defective memory cell rows in each of which the at least one error is detected, and
   wherein the row fault detector circuitry is configured to determine whether a row fault occurs in each of the plurality of defective memory cell rows based on a number of changes of the error parameter.

2. The semiconductor memory device of claim 1, wherein the ECC engine circuitry is configured to perform the plurality of error detection operations on the plurality of memory cell rows as a portion of a scrubbing operation or a normal read operation, and
   wherein the row fault detector circuitry is configured to,
      determine that the row fault occurs in a memory cell row from among the plurality of defective memory cell rows when the number of changes of the error parameter associated with the memory cell row is equal to or greater than a reference value; and
      transmit, to an external memory controller, a decoding status flag indicating that the row fault occurs.

3. The semiconductor memory device of claim 1, wherein:
   the error parameter includes a syndrome or a column address associated with the plurality of codewords in each of which the at least one error is detected; and
   the row fault detector circuitry includes:
      an error parameter storing table configured to store addresses of the plurality of defective memory cell rows as error addresses and configured to store the error parameter by accumulating the error parameter for each of the error addresses;
      an address comparator configured to compare a current error address obtained through a current error detection operation and a previous error address obtained through a previous error detection operation to output an address comparison signal; and
      a syndrome comparator configured to compare a current syndrome obtained through the current error detection operation and a previous syndrome obtained through the previous error detection operation to output a syndrome comparison signal, and
   the row fault detector circuitry is further configured to selectively store the error parameter in the error parameter storing table based on the address comparison signal and the syndrome comparison signal and configured to record the number of changes in the error parameter storing table.

4. The semiconductor memory device of claim 3, wherein:
   the error parameter includes the syndrome associated with the plurality of codewords in each of which the at least one error is detected; and
   the row fault detector circuitry is further configured to increase the number of changes whenever a value of the syndrome associated with a first defective memory cell row, from among the plurality of defective memory cell rows, changes in at least a portion of the plurality of error detection operations, based on the syndrome comparison signal.

5. The semiconductor memory device of claim 3, wherein:
   the error parameter includes the syndrome associated with the plurality of codewords in each of which the at least one error is detected; and
   the fault detector circuitry is further configured to maintain the number of changes when a value of the syndrome associated with a first defective memory cell row from among the plurality of defective memory cell rows is constant in each of the plurality of error detection operations, based on the syndrome comparison signal.

6. The semiconductor memory device of claim 3, wherein the ECC engine circuitry is configured to provide the row fault detector circuitry with a syndrome associated with the plurality of codewords in each of which the at least one error is detected in the plurality of error detection operations.

7. The semiconductor memory device of claim 3, wherein:
   the error parameter includes the column address associated with the plurality of codewords in each of which the at least one error is detected; and
   the row fault detector circuitry is further configured to increase the number of changes whenever the column address associated with a first defective memory cell row, from among the plurality of defective memory cell rows, changes in at least a portion of the plurality of error detection operations, based on the address comparison signal.

8. The semiconductor memory device of claim 3, wherein:
   the error parameter includes the column address associated with the plurality of codewords in each of which the at least one error is detected; and
   the row fault detector circuitry is further configured to maintain the number of changes when the column address associated with a first defective memory cell row from among the plurality of defective memory cell rows is the same in each of the plurality of error detection operations, based on the syndrome comparison signal.

9. The semiconductor memory device of claim 3, the row fault detector circuitry is further configured such that, in response to a first row address of a first error address obtained through one of the plurality of error detection operations not matching a respective one of row addresses of error addresses stored in the error parameter storing table, the row fault detector circuitry further stores the first row address and a first error parameter associated with the first row address in the error parameter storing table.

10. The semiconductor memory device of claim 9, wherein the row fault detector circuitry is further configured such that, in response to all entries of the error parameter storing table being and a second error address to be stored by the row fault detector circuitry not matching a respective one of the error addresses stored in the error parameter storing table, the row fault detector circuitry stores the second error address and a second error parameter in an entry associated with an error address with a lowest of the number of the changes.

11. The semiconductor memory device of claim 1, wherein the ECC engine circuitry includes an ECC decoder configured to perform the plurality of error detection operations, and
wherein the ECC decoder includes:
a syndrome generation circuit configured to generate check bits based on a main data read from a memory location in which the codeword is stored, and configured to compare the check bits with a parity data read from the memory location to generate a syndrome; and
error locator circuitry configured to generate an error position signal indicating a position of error in the codeword based on the syndrome, configured to generate an error generation signal indicating that the error occurs and configured to provide the error generation signal to the control logic circuitry, and
wherein the syndrome generation circuit is configured to provide the row fault detector circuitry with the syndrome associated with the codeword in which the error is detected.

12. The semiconductor memory device of claim 1, wherein:
the memory cell array includes a plurality of bank arrays;
the ECC engine circuitry includes a plurality of bank ECC engines corresponding to the plurality of bank arrays; and
the row fault detector circuitry includes a plurality of bank row fault detectors corresponding to the plurality of bank arrays.

13. The semiconductor memory device of claim 12, wherein each of the plurality of bank row fault detectors is configured to perform row fault detection operation on respective one of the plurality of bank arrays independently from one another.

14. The semiconductor memory device of claim 1, comprising:
at least one buffer die; and
a plurality of memory dies, the plurality of memory dies stacked on the at least one buffer die and conveying data through a plurality of through silicon via (TSV) lines,
wherein each of the plurality of memory dies includes the memory cell array and the row fault detector circuitry.

15. The semiconductor memory device of claim 1, further comprising:
scrubbing circuitry configured to generate scrubbing addresses for performing a scrubbing operation on a first memory cell row selected from the plurality of memory cell rows based on refresh row addresses for refreshing the plurality of memory cell rows,
wherein the scrubbing circuitry is configured to,
count the refresh row addresses to generate an internal scrubbing signal, and activate the internal scrubbing signal whenever N refresh row addresses of the refresh row addresses are counted, N being an integer greater than one; and
generate a normal scrubbing address associated with a normal scrubbing operation for the first memory cell row in a first scrubbing mode in response to the internal scrubbing signal and a scrubbing mode signal.

16. The semiconductor memory device of claim 15, wherein the normal scrubbing address includes a scrubbing row address designating one memory cell row and a scrubbing column address designating one of codewords included in the one memory cell row, and
wherein the scrubbing circuitry is further configured to,
increase the scrubbing column address by one during the internal scrubbing signal is activated; and
increase the scrubbing column address by one whenever the scrubbing column address reaches a maximum value.

17. The semiconductor memory device of claim 15, wherein the scrubbing circuitry is further configured to,
generate a weak codeword address associated with a weak scrubbing operation associated with weak codewords in the first memory cell row in a second scrubbing mode, in response to the internal scrubbing signal and the scrubbing mode signal, and
store address information of the weak codewords in an address storing table, and
generate a pointer signal which provides location information of the address storing table.

18. The semiconductor memory device of claim 15, further comprising:
victim address detector circuitry to count a number of accesses to a first memory region in the memory cell array to generate at least one victim address designating at least one adjacent memory region adjacent to the first memory region when the number of the counted accesses reaches a threshold value during a reference interval,
wherein the victim address detector circuitry is further configured to provide the at least one victim address to the scrubbing circuitry and
wherein the scrubbing circuitry is configured to store the at least one victim address in an address storing table therein as a weak codeword address.

19. A method of operating a semiconductor memory device including a memory cell array that includes a plurality of memory cell rows, each of the plurality of memory cell rows including a plurality of volatile memory cells, the method comprising:
performing, by an error correction code (ECC) engine, a plurality of error detection operations on each of the plurality of memory cell rows;
storing, by a row fault detector, syndrome or column address associated with each of a plurality of codewords in each of which at least one error is detected during the plurality of error detection operations, in an error parameter storing table by accumulating the syndrome or the column address for each of a plurality of defective memory cell rows in each of which the at least one error is detected; and
determining, by the row fault detector, whether a row fault occurs in each of the plurality of defective memory cell rows based on a number of changes of the syndrome or the column address stored in the error parameter storing table.

20. A semiconductor memory device comprising:
a memory cell array including a plurality of memory cell rows, each of the plurality of memory cell rows including volatile memory cells;
error correction code (ECC) engine circuitry;
row fault detector circuitry; and
control logic circuitry configured to control the ECC engine circuitry to perform a plurality of error detection operations on respective one of the plurality of memory cell rows,
wherein the control logic circuitry is configured to control the row fault detector circuitry to store an error parameter associated with each of a plurality of codewords in each of which at least one error is detected during the plurality of error detection operations, therein by accumulating the error parameter for each of a plurality of defective memory cell rows in each of which the at least one error is detected, and wherein the row fault detector circuitry is configured to determine whether a row fault occurs in each of the plurality of defective memory cell rows based on a number of changes of the error parameter, wherein the error parameter includes a syndrome or a column address associated with the plurality of codewords in each of which the at least one error is detected, and wherein the row fault detector circuitry includes:

an error parameter storing table configured to store addresses of the plurality of defective memory cell rows as error addresses and configured to store the error parameter by accumulating the error parameter for each of the error addresses;

an address comparator configured to compare a current error address obtained through a current error detection operation and a previous error address obtained through a previous error detection operation to output an address comparison signal; and a syndrome comparator configured to compare a current syndrome obtained through the current error detection operation and a previous syndrome obtained through the previous error detection operation to output a syndrome comparison signal, and wherein the row fault detector circuitry is further configured to selectively store the error parameter in the error parameter storing table based on the address comparison signal and the syndrome comparison signal and configured to record the number of changes in the error parameter storing table.

\* \* \* \* \*